United States Patent
Toyomasu et al.

(10) Patent No.: US 10,340,159 B2
(45) Date of Patent: Jul. 2, 2019

(54) CLEANING CHEMICAL SUPPLYING DEVICE, CLEANING CHEMICAL SUPPLYING METHOD, AND CLEANING UNIT

(71) Applicant: EBARA CORPORATION, Tokyo (JP)

(72) Inventors: Fujihiko Toyomasu, Tokyo (JP); Toru Maruyama, Tokyo (JP); Junji Kunisawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 275 days.

(21) Appl. No.: 14/730,584

(22) Filed: Jun. 4, 2015

(65) Prior Publication Data

US 2015/0357208 A1  Dec. 10, 2015

(30) Foreign Application Priority Data

Jun. 9, 2014 (JP) .................................. 2014-118556
Jun. 26, 2014 (JP) .................................. 2014-131045
Mar. 12, 2015 (JP) .................................. 2015-049038

(51) Int. Cl.
*B01F 15/00* (2006.01)
*H01L 21/67* (2006.01)
*B01F 3/08* (2006.01)

(52) U.S. Cl.
CPC ........ *H01L 21/67051* (2013.01); *B01F 3/088* (2013.01); *H01L 21/67017* (2013.01)

(58) Field of Classification Search
CPC ......... H01L 21/67051; H01L 21/67017; B01F 3/088

See application file for complete search history.

(56) References Cited

U.S. PATENT DOCUMENTS

| 5,331,364 A * | 7/1994 | Borden .................... B01F 3/088 396/626 |
| 6,354,922 B1 | 3/2002 | Sakurai et al. |
| 2002/0100495 A1* | 8/2002 | Bexten ..................... B08B 3/02 134/18 |
| 2003/0094196 A1* | 5/2003 | Siefering .......... H01L 21/67086 137/93 |
| 2004/0045592 A1* | 3/2004 | Yamamoto ............... B08B 3/02 134/157 |
| 2009/0188565 A1 | 7/2009 | Satake |

(Continued)

FOREIGN PATENT DOCUMENTS

| JP | 2001-135604 A | 5/2001 |
| JP | 2004-111668 A | 4/2004 |
| JP | 2007-141926 A | 6/2007 |

(Continued)

OTHER PUBLICATIONS

China Patent Application No. 201510306666.4; Office Action; dated Jan. 3, 2019; 8 pages.

*Primary Examiner* — Joseph L. Perrin
*Assistant Examiner* — Irina Graf
(74) *Attorney, Agent, or Firm* — Baker & Hostetler LLP

(57) ABSTRACT

A cleaning chemical supplying device, a cleaning chemical supplying method, and a cleaning unit capable of flexibly handling a change of a dilution ratio and suppression of an increase of a device size are provided. A cleaning chemical supplying device has a first in-line mixer, a second in-line mixer, a first chemical CLC box, a second chemical CLC box, and a DIWCLC box.

6 Claims, 9 Drawing Sheets

(56) References Cited

U.S. PATENT DOCUMENTS

2012/0111412 A1  5/2012  Satake
2014/0216505 A1  8/2014  Toyomasu et al.

FOREIGN PATENT DOCUMENTS

| JP | 2009-054959 A | 3/2009 |
| JP | 2009-172459 A | 8/2009 |
| JP | 2011-066235 A | 3/2011 |
| JP | 2012-099730 A | 5/2012 |
| JP | 2014-099530 A | 5/2014 |

\* cited by examiner

CLEANING CHEMICAL SUPPLYING DEVICE, CLEANING CHEMICAL SUPPLYING METHOD, AND CLEANING UNIT

TECHNICAL FIELD

The present invention relates to a cleaning chemical supplying device, a cleaning chemical supplying method, and a cleaning unit.

BACKGROUND ART

The present application claims priority to and benefit of Japanese Patent Application No. 2014-118556 filed on Jun. 9, 2014, Japanese Patent Application No. 2014-131045 filed on Jun. 26, 2014, and Japanese Patent Application No. 2015-049038 filed on Mar. 12, 2015, the contents of which are incorporated by reference herein in their entirety.

A CMP (Chemical Mechanical Polishing) device has a polishing device for polishing a surface of a semiconductor substrate on which a semiconductor chip is formed and a cleaning device for cleaning the semiconductor substrate polished by the polishing device while supplying a cleaning chemical. This cleaning device creates a cleaning chemical (diluted chemical) by mixing dilution water such as DIW (De-Ionized Water) in a chemical and cleans the semiconductor substrate by using the cleaning chemical (see Japanese Patent Laid-Open No. 2009-54959, for example).

In the cleaning device using the cleaning chemical, a cleaning chemical supplying device having an in-line flow meter in which a chemical flow meter and a DIW flow meter are juxtaposed in a pair has been used. Each of the chemical flow meter and the DIW flow meter includes a CLC (Closed Loop Controller) and executes feedback control of the respective flow rates so that a chemical flow rate and a DIW flow rate form a certain ratio. As a result, the chemical diluted at a certain ratio is supplied to a cleaning tank of the cleaning device.

In the prior-art chemical supplying device, the chemical flow meter, the DIW flow meter, and an in-line mixer for mixing the chemical and the DIW whose flow rates are controlled are accommodated in one box. That is, one DIW flow meter is designed to be combined with one chemical flow meter, and a size of one box is designed to contain only the two flow meters.

In recent years, in the cleaning device provided in the CMP device, a process for cleaning the semiconductor substrate by alternately using an acid chemical and an alkaline chemical is in demand. As described above, since the prior-art cleaning device is designed with the size that the box can contain only two flow meters, only two types of chemical flow meters can be contained in the box, and the DIW flow meter cannot be additionally provided in the box. Thus, in the prior-art chemical supplying device, two flow meters for chemicals are arranged in the box and two types of cleaning chemicals diluted in advance are supplied through the respective flow meters.

However, in the chemical supplying device using two types of cleaning chemicals diluted in advance, if a dilution ratio of the cleaning chemical is changed with a change of a process recipe, a cleaning chemical with a different dilution ratio needs to be prepared. That is, this chemical supplying device cannot flexibly handle the change of the process recipe.

On the other hand, if the above-described in-line flow meter is used, the change of the dilution ratio with the change of the process recipe can be handled only by changing flow rate set values of the chemical flow meter and the DIW flow meter. However, in order to supply two types of chemicals to the cleaning device, two in-line flow meters need to be prepared. In this case, since the DIW flow meter is provided in each of the two in-line flow meters, it has a problem in that the size of the chemical supplying device increases.

A differential pressure flow meter (orifice flow meter) is used in general for the chemical flow meter and the DIW flow meter. The differential pressure flow meter has an orifice arranged on a path through which a fluid passes and measures a mass flow rate (flow velocity) of the fluid on the basis of a differential pressure. A measurement range of the differential pressure flow meter, that is, a flow rate range controllable by the CLC is determined by a diameter of the orifice in terms of its structure. That is, the measurement range of the orifice flow meter is set in general such that a maximum/minimum flow rate ratio is approximately 1:9 as from 30 ml/min to 300 ml/min, for example. Therefore, the flow rate range controllable by the chemical flow meter and the DIW flow meter becomes a range determined in advance in terms of its structure.

In the prior-art cleaning chemical supplying device, if the dilution ratio of the cleaning chemical is changed or a supply flow rate of the cleaning chemical is changed with the change of the process recipe, required flow rates of the chemical and the DIW might deviate from the flow rate range controllable by the currently selected chemical flow meter and DIW flow meter in some cases. In such a case, the change of the process recipe is handled by selecting the chemical flow meter and the DIW flow meter again and by replacing the flow meters with those in the controllable flow rate range. Thus, if the flow rates of the chemical and the DIW required for the changed process recipe deviate from the flow rate ranges of the chemical flow meter and the DIW flow meter, the chemical flow meter and the DIW flow meter need to be replaced at each change of the process recipe, which takes a labor.

In the cleaning device of the CMP device, the cleaning chemical is used not only for cleaning of the substrate but also for prevention of oxidation of the substrate for the substrates waiting for cleaning (substrate to be cleaned next). In a cleaning process of the prior-art CMP device, cleaning of the substrate is not performed at the same time as waiting for cleaning. That is, while the substrate is being cleaned, the substrate is not transferred to a standby spot. However, in order to improve a throughput of the cleaning process, a process in which cleaning of the substrate and waiting for cleaning are performed at the same time is in demand in recent years. If cleaning of the substrate and waiting for cleaning are performed at the same time, since the cleaning chemical is used for each of them, larger flow rates of the chemical and the DIW than before become necessary. Moreover, a process capable of supplying small flow rates of the chemical and the DIW also needs to be handled. The flow rate range controllable by the prior-art chemical flow meter and the DIW flow meter cannot handle various processes.

The present invention was made in order to solve at least one of the above-described problems and one of its objects is to provide a cleaning chemical supplying device and a cleaning chemical supplying method which can flexibly handle a change in a dilution ratio and can suppress an increase in a device size.

Another object of the present invention is to supply a chemical and DIW in a wide flow rate range without replacing the flow meter.

SUMMARY OF INVENTION

According to an aspect of the present invention, a cleaning chemical supplying device is provided. This cleaning chemical supplying device is a cleaning chemical supplying device for supplying a cleaning chemical to a substrate cleaning device and has a first mixing portion for supplying a first cleaning chemical obtained by mixing a first chemical and dilution water to the substrate cleaning device, a second mixing portion for supplying a second cleaning chemical obtained by mixing a second chemical and dilution water to the substrate cleaning device, a first chemical control portion for controlling a flow rate of the first chemical to be supplied to the first mixing portion, a second chemical control portion for controlling a flow rate of the second chemical to be supplied to the second mixing portion, a dilution water control portion for controlling a flow rate of the dilution water to be supplied to the first mixing portion or the second mixing portion, and a dilution water supply switching portion for switching a supply destination of the dilution water from the first mixing portion to the second mixing portion or from the second mixing portion to the first mixing portion.

According to another aspect of the present invention, a cleaning chemical supplying method is provided. This cleaning chemical supplying method is a cleaning chemical supplying method for supplying a cleaning chemical to a substrate cleaning device and has a step of controlling a flow rate of a first chemical, a step of controlling a flow rate of dilution water, a step of supplying the first chemical and the dilution water to a first mixing portion and of mixing the first chemical and the dilution water, a first supply step of supplying a first cleaning chemical obtained by mixing the dilution water and the first chemical to the substrate cleaning device, a step of controlling a flow rate of a second chemical, a step of switching a supply destination of the dilution water from the first mixing portion to the second mixing portion, a step of supplying the second chemical and the dilution water to the second mixing portion and of mixing the second chemical and the dilution water, and a second supply step of supplying a second cleaning chemical obtained by mixing the dilution water to the substrate cleaning device.

According to another embodiment of the present invention, a cleaning unit is provided. This cleaning unit is a cleaning unit having a substrate cleaning device for cleaning a substrate and a cleaning chemical supplying device for supplying a cleaning chemical to the substrate cleaning device, and the substrate cleaning device has a nozzle for supplying the cleaning chemical to the substrate and a first ultrasonic flow meter for measuring a flow rate of the cleaning chemical to be supplied to the substrate, and the first ultrasonic flow meter is arranged at a position lower than a position of the nozzle.

According to an embodiment of the present invention, a cleaning unit is provided. This cleaning unit is a cleaning unit having a substrate cleaning device for cleaning a substrate and a cleaning chemical supplying device for supplying a cleaning chemical to the substrate cleaning device. The substrate cleaning device has a cleaning portion for cleaning the substrate and a standby portion in which a substrate waiting for cleaning in the cleaning portion is arranged and for supplying the cleaning chemical to the standby substrate. The cleaning chemical supplying device has a mixing portion for supplying the cleaning chemical obtained by mixing a chemical and dilution water to the cleaning portion and the standby portion, a chemical flow rate control portion for supplying the chemical to the mixing portion by controlling a flow rate of the chemical, and a dilution water flow rate control portion for supplying the dilution water to the mixing portion by controlling a flow rate of the dilution water. The chemical flow rate control portion includes a first chemical flow rate control portion and a second chemical flow rate control portion and is configured so as to supply the chemical whose flow rate is controlled by the first chemical flow rate control portion and/or the second chemical flow rate control portion to the mixing portion. The first chemical flow rate control portion is configured to be capable of controlling the flow rate in a first range. The second chemical flow rate control portion is configured to be capable of controlling a flow rate in a second range partially overlapping the first range. The dilution water flow rate control portion includes a first dilution water flow rate control portion and a second dilution water flow rate control portion and is configured so as to supply the dilution water whose flow rate is controlled by the first dilution water flow rate control portion and/or the second dilution water flow rate control portion to the mixing portion. The first dilution water flow rate control portion is configured to be capable of controlling a flow rate in a third range, and the second dilution water flow rate control portion is configured to be capable of controlling a flow rate in a fourth range partially overlapping the third range.

According to the present invention, a cleaning chemical supplying device and a cleaning chemical supplying method which can flexibly handle a change of a dilution ratio and suppress a size increase of the device can be provided.

According to the present invention, a chemical and DIW can be supplied in wide flow rate ranges without replacing the flow meter.

DESCRIPTION OF EMBODIMENTS

Figure 1:
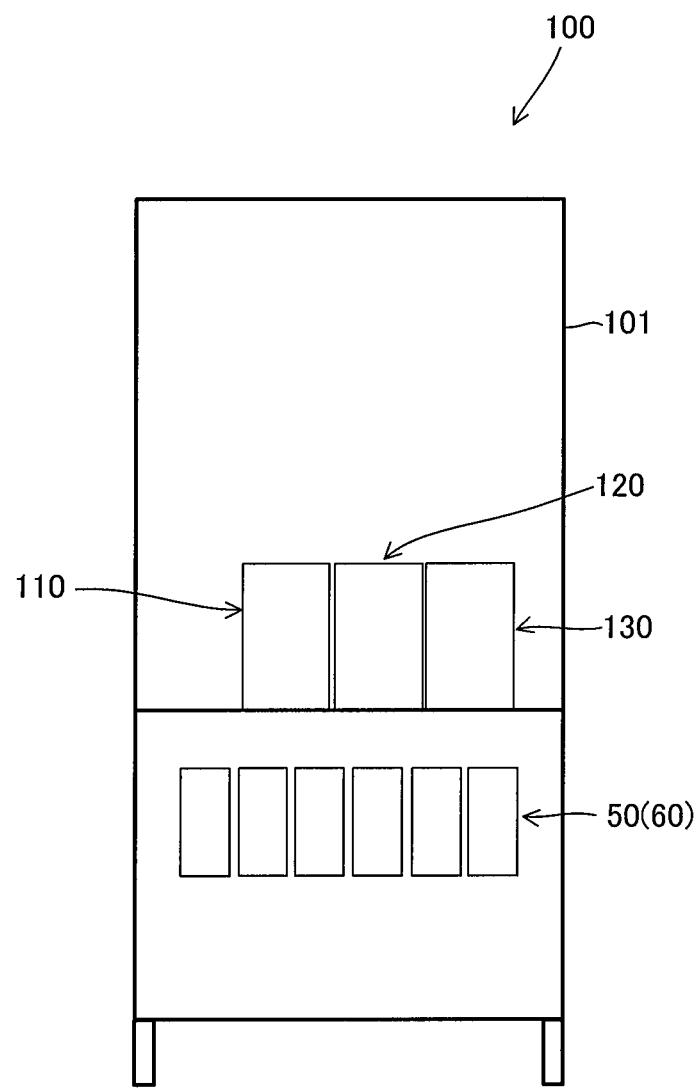
FIG. 1 is a schematic front view illustrating a chemical supplying device according to a first embodiment.

According to an aspect of the present invention, a cleaning chemical supplying device is provided. This cleaning chemical supplying device is a cleaning chemical supplying device for supplying a cleaning chemical to a substrate cleaning device and has a first mixing portion for supplying a first cleaning chemical obtained by mixing a first chemical and dilution water to the substrate cleaning device, a second mixing portion for supplying a second cleaning chemical obtained by mixing a second chemical and the dilution water to the substrate cleaning device, a first chemical control portion for controlling a flow rate of the first chemical to be supplied to the first mixing portion, a second chemical control portion for controlling a flow rate of the second chemical to be supplied to the second mixing portion, a dilution water control portion for controlling a flow rate of the dilution water to be supplied to the first mixing portion or the second mixing portion, and a dilution water supply switching portion for switching a supply destination of the dilution water from the first mixing portion to the second mixing portion or from the second mixing portion to the first mixing portion.

According to another aspect of the present invention, in the cleaning chemical supplying device, the first chemical control portion is configured to stop supply of the first chemical while the second cleaning chemical is supplied to the substrate cleaning device; while the second chemical control portion is configured to stop supply of the second chemical while the first cleaning chemical is supplied to the substrate cleaning device.

According to another aspect of the present invention, in the cleaning chemical supplying device, the dilution water supply switching portion is configured to supply the dilution water to the first mixing portion while the first chemical control portion supplies the first chemical to the first mixing portion and to supply the dilution water to the second mixing portion while the second chemical control portion supplies the second chemical to the second mixing portion.

According to another aspect of the present invention, the cleaning chemical supplying device has a first chemical supply source for supplying the first chemical to the first chemical control portion, a second chemical supply source for supplying the second chemical to the second chemical control portion, a first chemical inlet valve provided on a pipeline connecting the first chemical supply source and the first chemical control portion, and a second chemical inlet valve provided on a pipeline connecting the second chemical supply source and the second chemical control portion.

According to another aspect of the present invention, in the cleaning chemical supplying device, one of the first chemical and the second chemical is an alkaline chemical while the other is an acid chemical.

According to another aspect of the present invention, a cleaning chemical supplying method is provided. This cleaning chemical supplying method is a cleaning chemical supplying method for supplying a cleaning chemical to a substrate cleaning device and has a step of controlling a flow rate of a first chemical, a step of controlling a flow rate of dilution water, a step of supplying the first chemical and the dilution water to a first mixing portion and of mixing the first chemical and the dilution water, a first supply step of supplying a first cleaning chemical obtained by mixing the dilution water and the first chemical to the substrate cleaning device, a step of controlling a flow rate of a second chemical, a step of switching a supply destination of the dilution water from the first mixing portion to the second mixing portion, a step of supplying the second chemical and the dilution water to the second mixing portion and of mixing the second chemical and the dilution water, and a second supply step of supplying a second cleaning chemical obtained by mixing it with the dilution water to the substrate cleaning device.

According to another aspect of the present invention, in the cleaning chemical supplying method, the first supply step has a step of stopping supply of the first cleaning chemical while the second cleaning chemical is supplied to the substrate cleaning device in the second supply step, and the second supply step has a step of stopping supply of the second cleaning chemical while the first cleaning chemical is supplied to the substrate cleaning device in the first supply step.

According to another aspect of the present invention, in the cleaning chemical supplying method, one of the first chemical and the second chemical is an alkaline chemical while the other is an acid chemical.

According to another aspect of the present invention, a cleaning unit is provided. This cleaning unit is a cleaning unit having a substrate cleaning device for cleaning a substrate and a cleaning chemical supplying device for supplying a cleaning chemical to the substrate cleaning device, the substrate cleaning device having a nozzle for supplying a cleaning chemical to the substrate and a first ultrasonic flow meter for measuring a flow rate of the cleaning chemical supplied to the substrate, and the first ultrasonic flow meter is arranged at a position lower than a position of the nozzle.

According to another aspect of the present invention, in the cleaning unit, the first ultrasonic flow meter is configured such that a flow direction of the cleaning chemical passing through the first ultrasonic flow meter is directed to a vertical direction.

According to another aspect of the present invention, in the cleaning unit, the cleaning chemical supplying device has a mixing portion for supplying a cleaning chemical obtained by mixing a chemical and dilution water to the substrate cleaning device, a chemical flow rate control portion for controlling a flow rate of the chemical and for supplying the chemical to the mixing portion, a dilution water flow rate control portion for controlling a flow rate of the dilution water and for supplying the dilution water to the mixing portion, the chemical flow rate control portion and the dilution water flow rate control portion have a second ultrasonic flow meter and a third and a third ultrasonic flow meter, respectively, and the second ultrasonic flow meter and the third ultrasonic flow meter are arranged at positions lower than a position of the nozzle.

According to another aspect of the present invention, in the cleaning unit, the second ultrasonic flow meter and the third ultrasonic flow meter are arranged such that a flow direction of the dilution water flowing through the second ultrasonic flow meter and a flow direction of the chemical passing through the third ultrasonic flow meter are directed to the vertical directions.

According to an aspect of the present invention, a cleaning unit is provided. This cleaning unit is a cleaning unit having a substrate cleaning device for cleaning a substrate and a cleaning chemical supplying device for supplying a cleaning chemical to the substrate cleaning device. The substrate cleaning device has a cleaning portion for cleaning the substrate and a standby portion in which a substrate waiting for cleaning in the cleaning portion is arranged and for supplying a cleaning chemical to the standby substrate. The cleaning chemical supplying device has a mixing portion for supplying a cleaning chemical obtained by mixing a chemical and dilution water to the cleaning portion and the standby portion, a chemical flow rate control portion for controlling a flow rate of the chemical and for supplying the chemical to the mixing portion, and a dilution water flow rate control portion for controlling a flow rate of the dilution water and for supplying the dilution water to the mixing portion. The chemical flow rate control portion includes a first chemical flow rate control portion and a second chemical flow rate control portion and is configured to supply the chemical whose flow rate is controlled by the first chemical flow rate control portion and/or the second chemical flow rate control portion to the mixing portion. The first chemical flow rate control portion is configured to be capable of controlling a flow rate within a first range. The second chemical flow rate control portion is configured to be capable of controlling a flow rate within a second range partially overlapping with the first range. The dilution water flow rate control portion includes a first dilution water flow rate control portion and a second dilution water flow rate control portion and is configured to supply the dilution water whose flow rate is controlled by the first dilution water flow rate control portion and/or the second dilution water flow rate control portion to the mixing portion. The first dilution water flow rate control portion is configured to be capable of controlling a flow rate within a third range and the second dilution water flow rate control portion is configured to be capable of controlling a flow rate within a fourth range partially overlapping with the third range.

According to another aspect of the present invention, in the above-described cleaning unit, cleaning of the substrate in the cleaning portion and supply of the cleaning chemical to the substrate in the standby portion are performed at the same time.

According to another aspect of the present invention, in the above-described cleaning unit, the cleaning portion has an upper surface cleaning portion configured to supply the cleaning chemical to an upper surface of the substrate and a lower surface cleaning portion configured to supply the cleaning chemical to a lower surface of the substrate.

Embodiments of the present invention will be described below by referring to the attached drawings. In the figures described below, the same or similar reference numerals are given to the same or similar constituent elements and duplicated explanation will be omitted in some cases. The invention obtained by arbitrarily combining the individual constituent elements described below is also included in the technical idea targeted by the present invention.

First Embodiment

A first embodiment of the present invention will be described below by referring to the drawings. FIG. 1 is a schematic front view illustrating a chemical supplying device according to the first embodiment of the present invention. The chemical supplying device of this embodiment is configured to be capable of supplying a first chemical which is an alkaline chemical, for example, and a second chemical which is an acid chemical, for example, to a cleaning device provided in a CMP device. As illustrated in FIG. 1, a chemical supplying device 100 according to the first embodiment has a case 101, a DIWCLC box 110 (dilution water control portion), a first chemical CLC box 120 (first chemical control portion), and a second chemical CLC box 130 (second chemical control portion). The DIW-CLC box 110 controls supply of DIW (dilution water). The first chemical CLC box 120 controls supply of the first chemical. The second chemical CLC box 130 controls supply of the second chemical.

The chemical supplying device 100 further includes a plurality of chemical utility boxes 50 or 60 for leading chemicals from a first chemical supply source 20 and a second chemical supply source 30 (see FIGS. 2 and 3) to the chemical supplying device 100. In the illustrated example, six chemical utility boxes 50 or 60 are provided in the chemical supplying device 100, but this is an example, and the number of the chemical utility boxes 50 or 60 is changed as appropriate in accordance with a specification of the cleaning device.

The DIWCLC box 110, the first chemical CLC box 120, the second chemical CLC box 130, and the plurality of chemical utility boxes 50 or 60 are accommodated in the case 101.

The DIWCLC box 110 is configured to supply the DIW from a DIW supply source 10, which will be described later, to a first in-line mixer 72 or 72a or a second in-line mixer 73 or 73a (see FIGS. 2 and 3), which will be described later. Moreover, the DIWCLC box 110 can control a flow rate of the DIW to a predetermined flow rate by feedback control.

Figure 2:
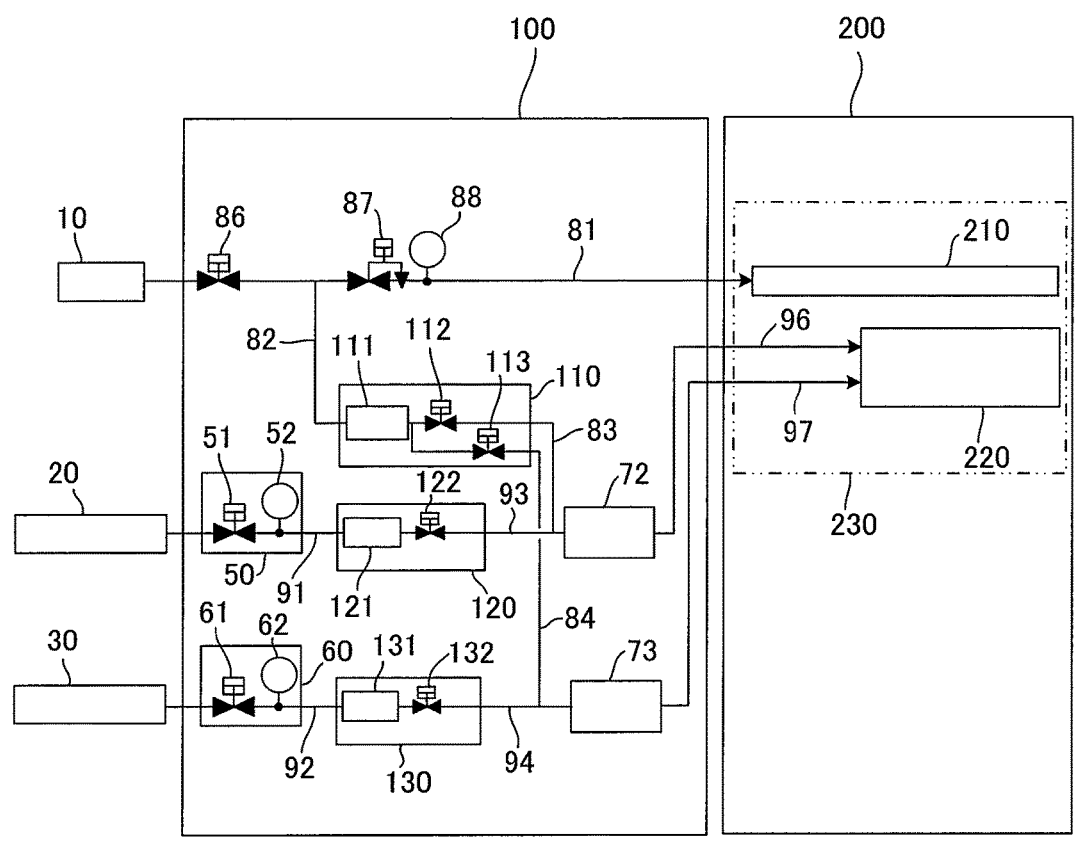
FIG. 2 is a diagram of a chemical supply flow of the chemical supplying device according to the first embodiment.
Figure 3:
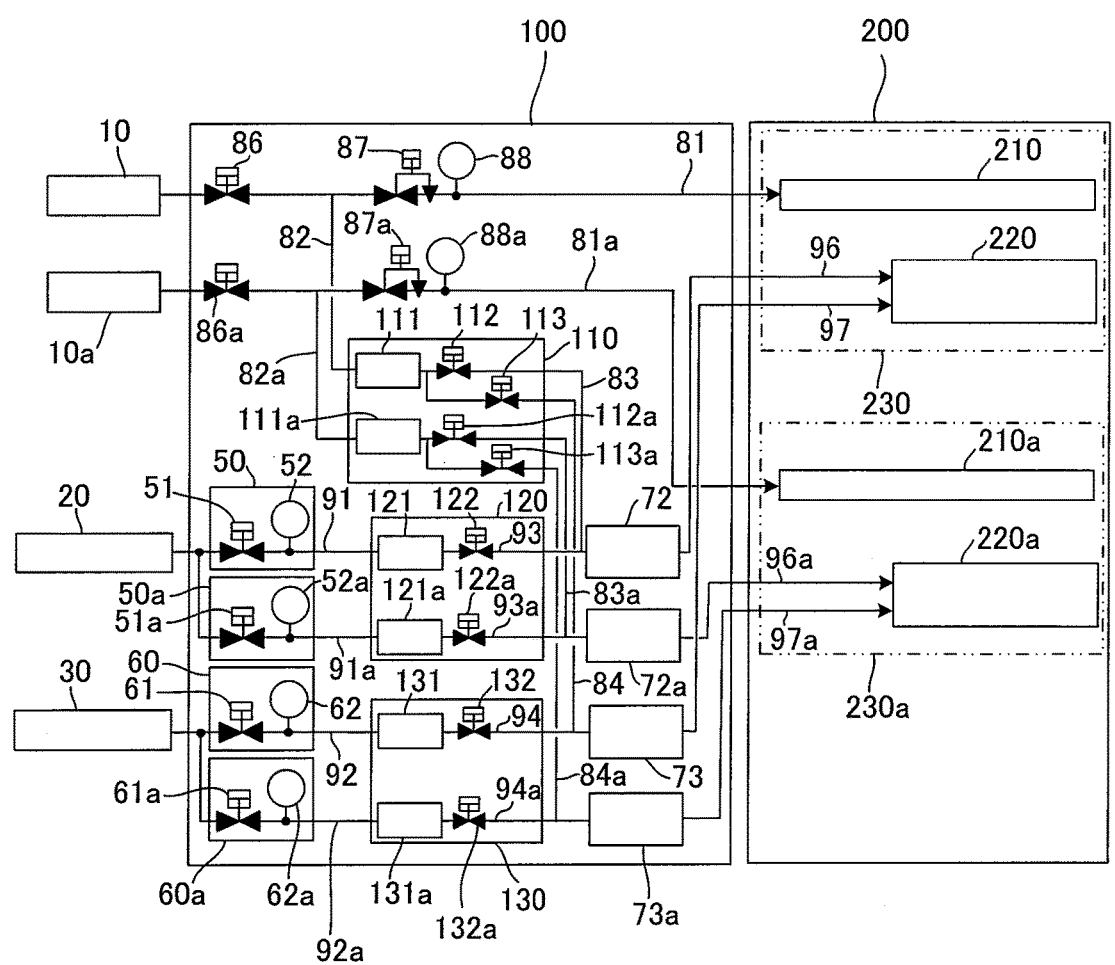
FIG. 3 is a diagram of a chemical supply flow of the chemical supplying device according to a second embodiment.

The first chemical CLC box 120 is configured to supply the first chemical from the first chemical supply source 20 to the first in-line mixer 72 or 72a (see FIGS. 2 and 3). Moreover, the first chemical CLC box 120 can control a flow rate of the first chemical to a predetermined flow rate by feedback control.

Similarly, the second chemical CLC box 130 is configured to supply the second chemical from the second chemical supply source 30 to the second in-line mixer 73 or 73a (see FIGS. 2 and 3), which will be described later. Moreover, the second chemical CLC box 130 can control a flow rate of the second chemical to a predetermined flow rate by feedback control.

The chemical supplying device 100 has a pipeline for transferring the DIW, the first chemical or the second chemical, a valve, a pressure meter and the like, though not shown. Details will be described in FIGS. 2 and 3.

FIG. 2 is a diagram of a chemical supply flow of the chemical supplying device 100 according to the first embodiment of the present invention. As illustrated, the chemical supplying device 100 is configured to fluidly communicate with the DIW supply source 10 for supplying the DIW, the first chemical supply source 20 for supplying the first chemical, and the second chemical supply source 30 for supplying the second chemical through pipelines, respectively. Moreover, the chemical supplying device 100 is configured to fluidly communicate with a cleaning device 200 (substrate cleaning device). Specifically, the chemical supplying device 100 is configured to fluidly communicate with the cleaning device 200 so as to supply the DIW, a diluted first chemical (first cleaning chemical), and a diluted second chemical (second cleaning chemical) to the cleaning device 200.

The cleaning device 200 has a DIW cleaning portion 210 for cleaning a cleaning target such as a semiconductor substrate or the like polished by a polishing device by using the DIW and a chemical cleaning portion 220 for cleaning the cleaning target such as the semiconductor substrate or the like polished by the polishing device by using the diluted chemical (cleaning chemical). This DIW cleaning portion 210 is configured from an ultrasonic water cleaning portion or other DIW cleaning portion and the like, for example. The chemical cleaning portion 220 is configured from a roll-type cleaning portion or the like, for example. The DIW cleaning portion 210 and the chemical cleaning portion 220 co-exist in the same cleaning tank 230.

The chemical supplying device 100 includes the first in-line mixer 72 (corresponding to an example of a first mixing portion), the second in-line mixer 73 (corresponding to an example of a second mixing portion), the first chemical CLC box 120, the second chemical CLC box 130, and the DIWCLC box 110. The first in-line mixer 72 generates the first cleaning chemical by mixing the first chemical and the DIW. The second in-line mixer 73 generates the second cleaning chemical by mixing the second chemical and the DIW. The first chemical CLC box 120 controls a flow rate of the first chemical supplied from the first chemical supply source 20 to the first in-line mixer 72. The second chemical CLC box 130 controls a flow rate of the second chemical supplied from the second chemical supply source 30 to the second in-line mixer 73. The DIWCLC box 110 controls a flow rate of the DIW supplied from the DIW supply source 10 to the first in-line mixer 72 or the second in-line mixer 73.

The first in-line mixer 72 is configured to supply the generated first cleaning chemical to the chemical cleaning portion 220. Similarly, the second in-line mixer 73 is configured to supply the generated second cleaning chemical to the chemical cleaning portion 220.

The DIWCLC box 110 has a first DIW supply valve 112, a second DIW supply valve 113, and a CLC (Closed Loop Controller) 111. By opening the first DIW supply valve 112, dilution DIW is supplied from the DIW supply source 10 to the first in-line mixer 72. By opening the second DIW supply valve 113, the dilution DIW is supplied from the DIW supply source 10 to the second in-line mixer 73. The CLC 111 controls a flow rate to be supplied to the first DIW supply valve 112 and the second DIW supply valve 113. Moreover, the CLC 111 measures a flow rate of the DIW flowing through the CLC 111. The CLC 111 controls (feedback control) an opening degree of an internal control valve of the CLC 111 on the basis of this measurement result so that the flow rate of the DIW flowing through the CLC 111 becomes a desired flow rate.

The DIWCLC box 110 supplies the DIW to the first in-line mixer 72 by closing the second DIW supply valve 113 and by opening the first DIW supply valve 112. On the other hand, the DIWCLC box 110 supplies the DIW to the second in-line mixer 73 by closing the first DIW supply valve 112 and by opening the second DIW supply valve 113. That is, the DIWCLC box 110, the first DIW supply valve 112, and the second DIW supply valve 113 function as a dilution water supply switching unit for switching the supply destination of the DIW between the first in-line mixer 72 and the second in-line mixer 73.

The first chemical CLC box 120 has a first chemical supply valve 122 for supplying a first chemical from the first chemical supply source 20 to the first in-line mixer 72 and a CLC 121 for measuring a flow rate of the first chemical flowing through the first chemical supply valve 122. The CLC 121 measures the flow rate of the first chemical flowing through the CLC 121. The CLC 121 controls (feedback control) an opening degree of an internal control valve of the CLC 121 on the basis of the measurement result so that the flow rate of the first chemical flowing through the CLC 121 becomes a desired flow rate.

The second chemical CLC box 130 has a second chemical supply valve 132 for supplying a second chemical from the second chemical supply source 30 to the second in-line mixer 73 and a CLC 131 for measuring a flow rate of the second chemical flowing through the second chemical supply valve 132. The CLC 131 measures the flow rate of the second chemical flowing through the CLC 131. The CLC 131 controls (feedback control) an opening degree of an internal control valve of the CLC 131 on the basis of this measurement result so that the flow rate of the second chemical flowing through the CLC 131 becomes a desired flow rate.

Moreover, the chemical supplying device 100 includes the chemical utility box 50 and the chemical utility box 60. The chemical utility box 50 introduces the first chemical from the first chemical supply source 20 to the CLC 121 of the first chemical CLC box 120. The chemical utility box 60 introduces the second chemical from the second chemical supply source 30 to the CLC 131 of the second chemical CLC box 130.

The chemical utility box 50 includes a first chemical inlet valve 51 provided on a pipeline 91 connecting the first chemical supply source 20 and the CLC 121 of the first chemical CLC box 120 and supplying the first chemical to the pipeline 91 and a pressure meter 52 for measuring a fluid pressure in the pipeline 91. The first chemical inlet valve 51 is opening/closing-controlled by a controller, not shown, for example.

Similarly, the chemical utility box 60 includes a second chemical inlet valve 61 provided on a pipeline 92 connecting the second chemical supply source 30 and the CLC 131 of the second chemical CLC box 130 and supplying the second chemical to the pipeline 92 and a pressure meter 62 for measuring a fluid pressure in the pipeline 92. The second chemical inlet valve 61 is opening/closing-controlled by a controller, not shown, for example.

The chemical supplying device 100 has a DIW supply pipeline 81 having one end connected to the DIW supply source 10 and the other end connected to the DIW cleaning portion 210 of the cleaning device 200. In the DIW supply pipeline 81, a DIW supply valve 86, a DIW pressure control regulator 87, and a DIW pressure meter 88 are provided. The DIW supply valve 86 controls supply of the DIW from the DIW supply source 10 to the DIW supply pipeline 81 by being opened/closed. The DIW pressure control regulator 87 controls a supply pressure of the DIW from the DIW supply pipeline 81 to the DIW cleaning portion 210. The DIW pressure meter 88 measures a pressure of the DIW passing through the DIW supply pipeline 81.

A DIW branch pipeline 82 with one end connected to the CLC 111 of the DIWCLC box 110 is connected to the DIW supply pipeline 81 between the DIW supply valve 86 and the DIW pressure control regulator 87. A first DIW pipeline 83 fluidly-communicating with the first in-line mixer 72 and a second DIW pipeline 84 fluidly-communicating with the second in-line mixer 73 are connected to the CLC 111. The first DIW supply valve 112 is provided on the first DIW pipeline 83 and is opening/closing-controlled when the DIW is supplied to the first in-line mixer 72. The second DIW supply valve 113 is provided on the second DIW pipeline 84 and is opening/closing-controlled when the DIW is supplied to the second in-line mixer 73.

A first chemical pipeline 93 fluidly-communicating with the first in-line mixer 72 is connected to the CLC 121 of the first chemical CLC box 120. The first chemical supply valve 122 is provided on the first chemical pipeline 93 and is opening/closing-controlled when the first chemical is supplied to the first in-line mixer 72. A first cleaning chemical pipeline 96 with one end connected to the chemical cleaning portion 220 is connected to the first in-line mixer 72.

A second chemical pipeline 94 fluidly-communicating with the second in-line mixer 73 is connected to the CLC 131 of the second chemical CLC box 130. The second chemical supply valve 132 is provided on the second chemical pipeline 94 and is opening/closing-controlled when the second chemical is supplied to the second in-line mixer 73.

A second cleaning chemical pipeline 97 with one end connected to the chemical cleaning portion 220 is connected to the second in-line mixer 73.

The CLC 111 of the DIWCLC box 110, the CLC 121 of the first chemical CLC box 120, and the CLC 131 of the second chemical CLC box 130 are configured to be capable of receiving a signal indicating a predetermined flow rate value from a controller, not shown. On the basis of this flow rate value, opening degrees of the internal control valves of the CLC 111, the CLC 121, and the CLC 131 are controlled.

Subsequently, a chemical supply process in the chemical supplying device 100 illustrated in FIG. 2 will be described. When the first cleaning chemical is to be supplied to the chemical cleaning portion 220 of the cleaning device 200, first, the first chemical inlet valve 51 of the chemical utility box 50 is opened. The flow rate of the first chemical is controlled in the CLC 121 of the first chemical CLC box 120, and the first chemical in a predetermined flow rate is supplied from the first chemical supply source 20 to the first in-line mixer 72.

When the DIW supply valve 86 on the DIW supply pipeline 81 is opened, the DIW is supplied to the CLC 111 of the DIWCLC box 110 from the DIW supply source 10. By opening the first DIW supply valve 112, the DIW is supplied from the DIWCLC box 110 to the first in-line mixer 72. At this time, the second DIW supply valve 113 is kept closed.

The first chemical and the DIW supplied to the first in-line mixer 72 are mixed. The first cleaning chemical generated by that is supplied to the chemical cleaning portion 220 through the first cleaning chemical pipeline 96.

While the first cleaning chemical is supplied to the chemical cleaning portion 220, the supply of the second chemical to the second in-line mixer 73 is stopped. Specifically, the second chemical inlet valve 61 of the chemical utility box 60 and/or the second chemical supply valve 132 of the second chemical CLC box 130 are closed. As a result, to the chemical cleaning portion 220, the second cleaning chemical is not supplied but only the first cleaning chemical is supplied.

In the chemical supplying device 100 according to this embodiment, the first cleaning chemical and the second cleaning chemical can be alternately supplied. When the first cleaning chemical is to be switched to the second cleaning chemical, the first DIW supply valve 112 of the DIWCLC box 110 is closed, and the second DIW supply valve 113 is opened. As a result, the DIW is supplied from the DIWCLC box 110 to the second in-line mixer 73. Subsequently, the second chemical inlet valve 61 of the chemical utility box 60 is opened. The flow rate of the second chemical is controlled by the CLC 131 of the second chemical CLC box 130 and the second chemical in the predetermined flow rate is supplied from the second chemical supply source 30 to the second in-line mixer 73. The second chemical and the DIW supplied to the second in-line mixer 73 are mixed. The second cleaning chemical generated by that is supplied to the chemical cleaning portion 220 through the second cleaning chemical pipeline 97.

While the second cleaning chemical is supplied to the chemical cleaning portion 220, the supply of the first chemical to the first in-line mixer 72 is stopped. Specifically, the first chemical inlet valve 51 of the chemical utility box 50 and/or the first chemical supply valve 122 of the first chemical CLC box 120 are closed. As a result, to the chemical cleaning portion 220, the first cleaning chemical is not supplied but only the second cleaning chemical is supplied.

Moreover, when the second cleaning chemical is to be switched to the first cleaning chemical, the second DIW supply valve 113 of the DIWCLC box 110 is closed, and the first DIW supply valve 112 is opened. Moreover, the first chemical inlet valve 51 of the chemical utility box 50 is opened, and the first chemical supply valve 122 of the first chemical CLC box 120 is opened. Moreover, the second chemical inlet valve 61 of the chemical utility box 60 and/or the second chemical supply valve 132 are closed. As a result, to the chemical cleaning portion 220, the second cleaning chemical is not supplied but only the first cleaning chemical is supplied.

In this embodiment, flow rate ranges of the first chemical and the second chemical whose flow rates are controlled by the first chemical CLC box 120 and the second chemical CLC box 130 are 30 ml/min or more and 300 ml/min or less, for example. Moreover, the flow rates range of the DIW whose flow rate is controlled by the DIWCLC box 110 is 200 ml/min or more and 2000 ml/min or less, for example. Therefore, the dilution ratio between the first chemical or the second chemical and the DIW is 1:1 or more and 1:65 or less.

As described above, the chemical supplying device 100 according to this embodiment has the DIWCLC box 110 for controlling the flow rate of the DIW supplied from the DIW supply source 10 to the first in-line mixer 72 or the second in-line mixer 73. Moreover, the chemical supplying device 100 switches the supply destination of the DIW between the first in-line mixer 72 and the second in-line mixer 73. Therefore, by controlling the flow rate of the DIW to be supplied to the first in-line mixer 72 and the second in-line mixer 73, a change of the dilution ratio of the first chemical and the second chemical can be flexibly handled.

In this embodiment, since the dilution of the first chemical and the second chemical can be made in the common DIWCLC box 110, there is no need to provide two DIW flow meters as before, and size increase of the chemical supplying device 100 can be suppressed. In other words, since the number of DIW flow meters can be made smaller than before, a device cost can be reduced.

If dilution of the first chemical and the second chemical is performed by using two DIW flow meters as before, errors (instrumental errors) of the two DIW flow meters are different. Therefore, even if the same dilution ratio is set and the first chemical and the second chemical are diluted, there is a concern that the same dilution ratio cannot be obtained due to the instrumental errors. On the other hand, in the chemical supplying device 100 according to this embodiment, since the dilution of the first chemical and the second chemical can be performed in the common DIWCLC box 110, the difference in the dilution ratio between the first chemical and the second chemical caused by the instrumental error of the DIWCLC box 110 can be solved.

Moreover, in the chemical supplying device 100 according to this embodiment, the supply of the second chemical is stopped while the first cleaning chemical is supplied to the chemical cleaning portion 220 of the cleaning device 200; the supply of the first chemical is stopped while the second cleaning chemical is supplied to the chemical cleaning portion 220. Therefore, the first chemical which is an alkaline chemical and the second chemical which is an acid chemical are prevented from being mixed during cleaning in the cleaning device 200, and generation of a toxic gas caused by mixing of the alkaline chemical and the acid chemical can be prevented.

Second Embodiment

Subsequently, a chemical supplying device according to a second embodiment of the present invention will be described. FIG. 3 is a view of a chemical supply flow of the chemical supplying device 100 according to the second embodiment of the present invention. A schematic front view of the chemical supplying device 100 according to the second embodiment is similar to the schematic front view of the chemical supplying device 100 illustrated in FIG. 1, and the explanation will be omitted.

The second embodiment is different from the first embodiment in a point that the cleaning device 200 includes the DIW cleaning portions and the chemical cleaning portions in two each. With that, the DIWCLC box 110 of the chemical supplying device 100, the first chemical CLC box 120, and the second chemical CLC box 130 are provided with the CLC two each, respectively, which is also different from the first embodiment. In addition, the numbers of the valves and the chemical utility boxes and the pipeline configuration are also different from the first embodiment. The differences from the first embodiment will be mainly described below, and the same reference numerals are given to the configurations similar to those in the first embodiment, and the explanation will be omitted.

As illustrated in FIG. 3, the chemical supplying device 100 is configured to fluidly communicate with a DIW supply source 10a for supplying the DIW through a pipeline. The cleaning device 200 has a DIW cleaning portion 210a for cleaning a cleaning target such as a semiconductor substrate polished by a polishing device and the like by using the DIW and a chemical cleaning portion 220a for cleaning the cleaning target such as a semiconductor substrate polished by a polishing device and the like by using a diluted chemical (cleaning chemical). The DIW cleaning portion 210a is configured from an ultrasonic water cleaning portion or other DIW cleaning portions or the like, for example, similarly to the DIW cleaning portion 210. The chemical cleaning portion 220a is configured from a roll-type cleaning portion or the like, for example, similarly to the chemical cleaning portion 220. This DIW cleaning portion 210a and the chemical cleaning portion 220a co-exist in the same cleaning tank 230a.

The chemical supplying device 100 includes a first in-line mixer 72a (first mixing portion) for mixing the first chemical and the DIW so as to generate a first cleaning chemical, and a second in-line mixer 73a (second mixing portion) for mixing the second chemical and the DIW so as to generate a second cleaning chemical. The first chemical CLC box 120 is configured to control a flow rate of the first chemical supplied from the first chemical supply source 20 to the first in-line mixer 72a. The second chemical CLC box 130 is configured to control a flow rate of the second chemical supplied from the second chemical supply source 30 to the second in-line mixer 73a. The DIWCLC box 110 is configured to control a flow rate of the DIW supplied from a DIW supply source 10a to the first in-line mixer 72a or the second in-line mixer 73a.

The first in-line mixer 72a is configured to supply the generated first cleaning chemical to the chemical cleaning portion 220a. Similarly, the second in-line mixer 73a is configured to supply the generated second cleaning chemical to the chemical cleaning portion 220a.

The DIWCLC box 110 has a first DIW supply valve 112a, a second DIW supply valve 113a, and a CLC 111a. The first DIW supply valve 112a supplies the dilution DIW from the DIW supply source 10a to the first in-line mixer 72a. The second DIW supply valve 113a supplies the dilution DIW from the DIW supply source 10a to the second in-line mixer 73a. The CLC 111a control flow rates to be supplied to the first DIW supply valve 112a and the second DIW supply valve 113a. The CLC 111a measures a flow rate of the DIW flowing through the CLC 111a. The CLC 111a controls (feedback control) an opening degree of an internal control valve of the CLC 111a on the basis of this measurement result so that the flow rate of the DIW flowing through the CLC 111a becomes a desired flow rate.

The DIWCLC box 110 supplies the DIW to the first in-line mixer 72a by closing the second DIW supply valve 113a and by opening the first DIW supply valve 112a. On the other hand, the DIWCLC box 110 supplies the DIW to the second in-line mixer 73a by closing the first DIW supply valve 112a and by opening the second DIW supply valve 113a. That is, the DIWCLC box 110, the first DIW supply valve 112a, and the second DIW supply valve 113a function as a dilution water supply switching unit for switching a supply destination of the DIW between the first in-line mixer 72a and the second in-line mixer 73a.

The first chemical CLC box 120 has a first chemical supply valve 122a for supplying a first chemical from the first chemical supply source 20 to the first in-line mixer 72a and a CLC 121a for measuring a flow rate of the first chemical flowing through the first chemical supply valve 122a. The CLC 121a measures the flow rate of the first chemical flowing through the CLC 121a. The CLC 121a controls (feedback control) an opening degree of an internal control valve of the CLC 121a on the basis of this measurement result so that the flow rate of the first chemical flowing through the CLC 121a becomes a desired flow rate.

The second chemical CLC box 130 has a second chemical supply valve 132a for supplying a second chemical from the second chemical supply source 30 to the second in-line mixer 73a and a CLC 131a for measuring a flow rate of the second chemical flowing through the second chemical supply valve 132a. The CLC 131a measures the flow rate of the second chemical flowing through the CLC 131a. The CLC 131a controls (feedback control) an opening degree of an internal control valve of the CLC 131a on the basis of this measurement so that the flow rate of the second chemical flowing through the CLC 131a becomes a desired flow rate.

Moreover, the chemical supplying device 100 includes a chemical utility box 50a and a chemical utility box 60a. The chemical utility box 50a introduces the first chemical from the first chemical supply source 20 to the CLC 121a of the first chemical CLC box 120. The chemical utility box 60a introduces the second chemical from the second chemical supply source 30 to the CLC 131a of the second chemical CLC box 130.

The chemical utility box 50a includes a first chemical inlet valve 51a provided on a pipeline 91a connecting the first chemical supply source 20 and the CLC 121a of the first chemical CLC box 120 and a pressure meter 52a for measuring a fluid pressure in the pipeline 91a. The first chemical inlet valve 51a is opening/closing-controlled by a controller, not shown, for example, and supplies the first chemical to the pipeline 91a.

Similarly, the chemical utility box 60a includes a second chemical inlet valve 61a provided on a pipeline 92a connecting the second chemical supply source 30 and the CLC 131a of the second chemical CLC box 130 and a pressure meter 62a for measuring a fluid pressure in the pipeline 92a. The second chemical inlet valve 61a is opening/closing-controlled by a controller, not shown, for example, and supplies the second chemical to the pipeline 92a.

The chemical supplying device 100 includes a DIW supply pipeline 81a having one end connected to the DIW supply source 10a and the other end connected to the DIW cleaning portion 210a of the cleaning device 200. In the DIW supply pipeline 81a, a DIW supply valve 86a, a DIW pressure control regulator 87a, and a DIW pressure meter 88a are provided. The DIW supply valve 86a controls supply of the DIW from the DIW supply source 10a to the DIW supply pipeline 81a by being opened/closed. The DIW pressure control regulator 87a controls a supply pressure of the DIW from the DIW supply pipeline 81a to the DIW cleaning portion 210a. The DIW pressure meter 88a measures a pressure of the DIW passing through the DIW supply pipeline 81a.

A DIW branch pipeline 82a with one end connected to the CLC 111a of the DIWCLC box 110 is connected to the DIW supply pipeline 81a between the DIW supply valve 86a and the DIW pressure control regulator 87a. A first DIW pipeline 83a fluidly-communicating with the first in-line mixer 72a and a second DIW pipeline 84a fluidly-communicating with the second in-line mixer 73a are connected to the CLC 111a. The first DIW supply valve 112a is provided on the first DIW pipeline 83a and is opening/closing-controlled when the DIW is supplied to the first in-line mixer 72a. The second DIW supply valve 113a is provided on the second DIW pipeline 84a and is opening/closing-controlled when the DIW is supplied to the second in-line mixer 73a.

A first chemical pipeline 93a fluidly-communicating with the first in-line mixer 72a is connected to the CLC 121a of the first chemical CLC box 120. The first chemical supply valve 122a is provided on the first chemical pipeline 93a and is opening/closing-controlled when the first chemical is supplied to the first in-line mixer 72a. A first cleaning chemical pipeline 96a with one end connected to the chemical cleaning portion 220a is connected to the first in-line mixer 72a.

A second chemical pipeline 94a fluidly-communicating with the second in-line mixer 73a is connected to the CLC 131a of the second chemical CLC box 130. The second chemical supply valve 132a is provided on the second chemical pipeline 94a and is opening/closing-controlled when the second chemical is supplied to the second in-line mixer 73a. A second cleaning chemical pipeline 97a with one end connected to the chemical cleaning portion 220a is connected to the second in-line mixer 73a.

The CLC 111a of the DIWCLC box 110, the CLC 121a of the first chemical CLC box 120, and the CLC 131a of the second chemical CLC box 130 are configured to be capable of receiving a signal indicating a predetermined flow rate value from a controller, not shown. On the basis of this flow rate value, opening degrees of the internal control valves of the CLC 111a, the CLC 121a, and the CLC 131a are controlled.

Subsequently, a chemical supply process in the chemical supplying device 100 illustrated in FIG. 3 will be described. The chemical supplying device 100 according to the second embodiment is configured such that the first cleaning chemical or the second cleaning chemical can be supplied to the chemical cleaning portion 220 as described in the first embodiment and the first cleaning chemical or the second cleaning chemical can be supplied also to the chemical cleaning portion 220a. Since the process of supplying the first cleaning chemical or the second cleaning chemical to the chemical cleaning portion 220 is similar to that in the first embodiment, the explanation will be omitted, and the process of supplying the first cleaning chemical or the second cleaning chemical to the chemical cleaning portion 220a will be described.

When the first cleaning chemical is to be supplied to the chemical cleaning portion 220a of the cleaning device 200, first, the first chemical inlet valve 51a of the chemical utility box 50a is opened. The flow rate of the first chemical is controlled in the CLC 121a of the first chemical CLC box 120, and the first chemical in a predetermined flow rate is supplied from the first chemical supply source 20 to the first in-line mixer 72a.

When the DIW supply valve 86a on the DIW supply pipeline 81a is opened, the DIW is supplied to the CLC 111a of the DIWCLC box 110 from the DIW supply source 10a. By opening the first DIW supply valve 112a, the DIW is supplied from the DIWCLC box 110 to the first in-line mixer 72a. At this time, the second DIW supply valve 113a is kept closed.

The first chemical and the DIW supplied to the first in-line mixer 72a are mixed. The first cleaning chemical generated by that is supplied to the chemical cleaning portion 220a through the first cleaning chemical pipeline 96a.

While the first cleaning chemical is supplied to the chemical cleaning portion 220a, the supply of the second chemical to the second in-line mixer 73a is stopped. Specifically, the second chemical inlet valve 61a of the chemical utility box 60a and/or the second chemical supply valve 132a of the second chemical CLC box 130 are closed. As a result, to the chemical cleaning portion 220a, the second cleaning chemical is not supplied but only the first cleaning chemical is supplied.

In the chemical supplying device 100 according to the second embodiment, the first cleaning chemical and the second cleaning chemical can be alternately supplied not only to the chemical cleaning portion 220 but also to the chemical cleaning portion 220a. When the first cleaning chemical is to be switched to the second cleaning chemical, the DIWCLC box 110 closes the first DIW supply valve 112a and opens the second DIW supply valve 113a. As a result, the DIW is supplied from the DIWCLC box 110 to the second in-line mixer 73a.

Moreover, the second chemical inlet valve 61a of the chemical utility box 60a is opened. The flow rate of the second chemical is controlled in the CLC 131a of the second chemical CLC box 130, and the second chemical in a predetermined flow rate is supplied from the second chemical supply source 30 to the second in-line mixer 73a.

The second chemical and the DIW supplied to the second in-line mixer 73a are mixed. The second cleaning chemical generated by that is supplied to the chemical cleaning portion 220a through the second cleaning chemical pipeline 97a.

While the second cleaning chemical is supplied to the chemical cleaning portion 220a, the supply of the first chemical to the first in-line mixer 72a is stopped. Specifically, the first chemical inlet valve 51a of the chemical utility box 50a and/or the first chemical supply valve 122a of the first chemical CLC box 120 are closed. As a result, to the chemical cleaning portion 220a, the first cleaning chemical is not supplied but only the second cleaning chemical is supplied.

Moreover, when the second cleaning chemical is to be switched to the first cleaning chemical, the second DIW supply valve 113a of the DIWCLC box 110 is closed, and the first DIW supply valve 112a is opened. Moreover, the first chemical inlet valve 51a of the chemical utility box 50a is opened, and the first chemical supply valve 122a of the first chemical CLC box 120 is opened. Moreover, the second chemical inlet valve 61a of the chemical utility box 60a and/or the second chemical supply valve 132a are closed. As a result, to the chemical cleaning portion 220a, the second cleaning chemical is not supplied but only the first cleaning chemical is supplied.

In this embodiment, flow rate ranges of the first chemical and the second chemical whose flow rates are controlled by the CLC 121 and 121a of the first chemical CLC box 120 and by the CLC 131 and 131a of the second chemical CLC box 130 are 30 ml/min or more and 300 ml/min or less, respectively, for example. Moreover, the flow rate range of the DIW whose flow rate is controlled by the CLC 111 and 111a of the DIWCLC box 110 is 200 ml/min or more and 2000 ml/min or less, respectively, for example. Therefore, the dilution ratio between the first chemical or the second chemical and the DIW is 1:1 or more and 1:65 or less.

The chemical supplying device 100 according to the second embodiment has an advantage similar to that of the chemical supplying device 100 according to the first embodiment. In addition, the chemical supplying device 100 according to the second embodiment can alternately supply the first cleaning chemical and the second cleaning chemical to the two chemical cleaning portions 220 and 220a.

In the second embodiment, it is described that the first cleaning chemical and the second cleaning chemical are supplied to the two chemical cleaning portions 220 and 220a, but this is not limited thereto, and the first cleaning chemical and the second cleaning chemical can be supplied to three or more chemical cleaning portions. In that case, the number of CLC corresponding to the chemical cleaning portions may be added to the DIWCLC box 110, the first chemical CLC box 120, and the second chemical CLC box 130.

In the first embodiment and the second embodiment, it is described that the first chemical is an alkaline chemical and the second chemical is an acid chemical, but to the contrary, the first chemical may be an acid chemical and the second chemical may be an alkaline chemical.

Third Embodiment

Figure 4:
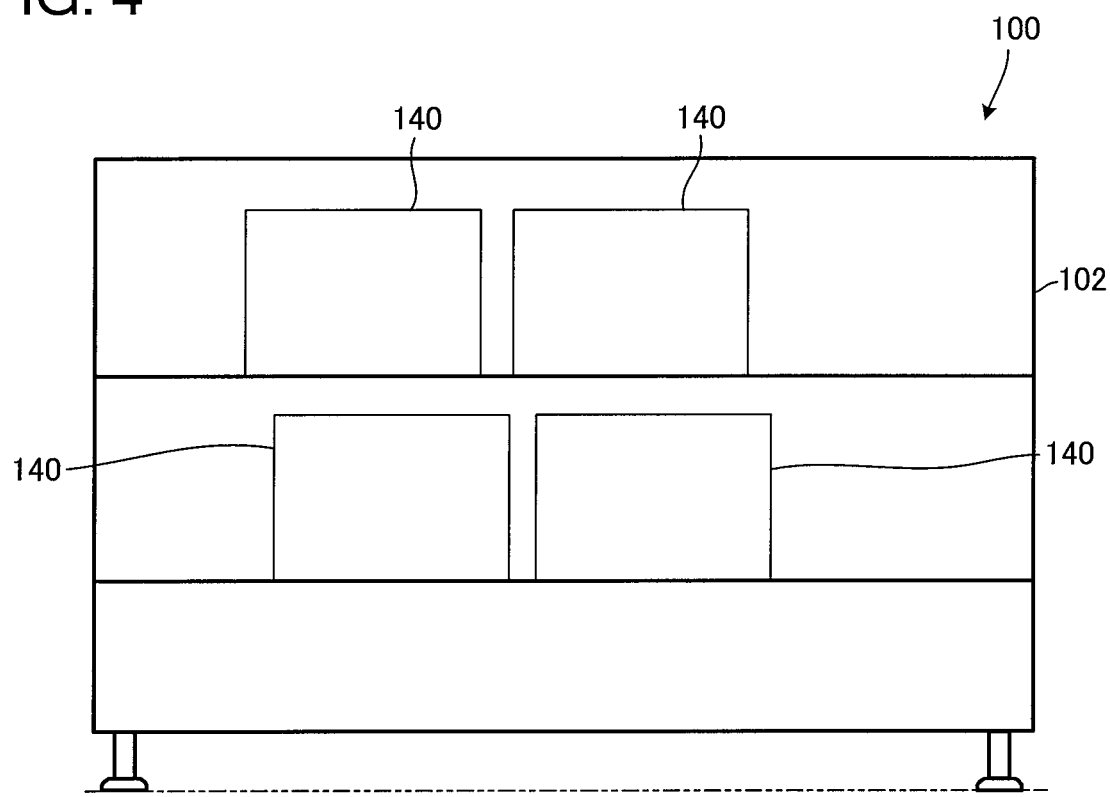
FIG. 4 is a schematic side view illustrating a chemical supplying device provided in a cleaning unit according to a third embodiment.

Subsequently, a cleaning unit according to a third embodiment of the present invention will be described. FIG. 4 is a schematic side view illustrating a chemical supplying device provided in the cleaning unit according to the third embodiment. The chemical supplying device is configured to be capable of supplying a chemical such as fluoric acid, ammonium and the like, for example, to the cleaning device for cleaning each portion of the CMP device.

As illustrated in FIG. 4, the chemical supplying device 100 according to this embodiment has a frame 102 and a chemical dilution box 140 for diluting the chemical by DIW (dilution water) and for supplying the diluted chemical (cleaning chemical). In the illustrated example, four chemical dilution boxes 140 are provided in the chemical supplying device 100, but this is an example, and the number of the chemical dilution boxes 140 is changed as appropriate in accordance with the specification of the cleaning device. As illustrated, the chemical dilution box 140 is accommodated in the frame 102. The chemical dilution box 140 is configured to be capable of mixing the DIW from the DIW supply source 10, which will be described later, and the chemical from a chemical supply source 40 and supplying the cleaning chemical to the cleaning device 200 (see FIG. 6). The chemical supplying device 100 has a pipeline for transferring the DIW or the chemical, a valve, a pressure meter and the like, though not shown. The details thereof will be described in FIG. 6.

Figure 5:
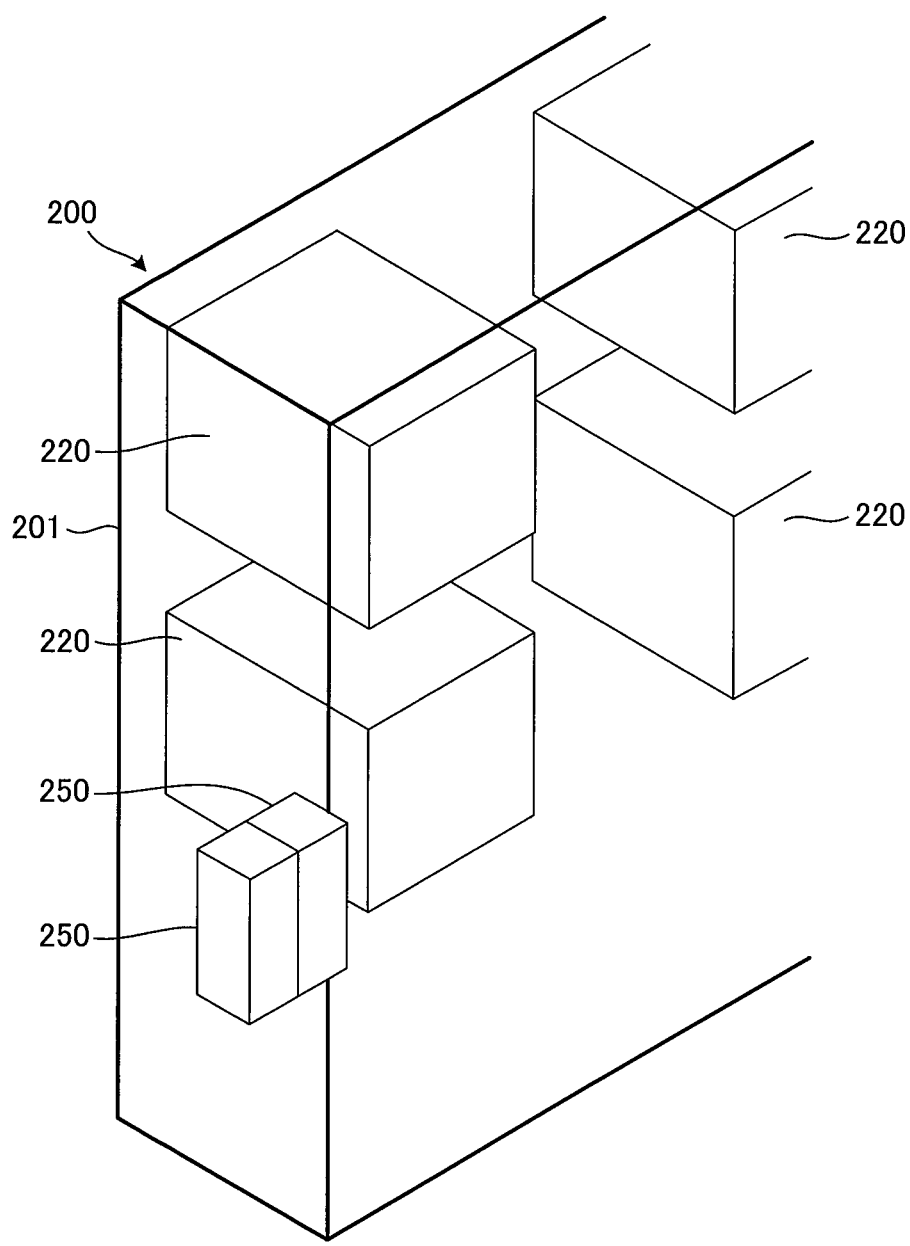
FIG. 5 is a schematic perspective view illustrating a cleaning device provided in the cleaning unit according to the third embodiment.

FIG. 5 is a schematic perspective view illustrating the cleaning device provided in the cleaning unit according to the third embodiment. The cleaning device is a device for cleaning the semiconductor substrate and each portion of the CMP device using the cleaning chemical supplied from the chemical supplying device 100 illustrated in FIG. 4.

As illustrated in FIG. 5, the cleaning device 200 has a frame 201 and a chemical cleaning portion 220 for cleaning a semiconductor substrate or the like using the cleaning chemical and a plurality of chemical supply boxes 250 for supplying the cleaning chemical to the chemical cleaning portion 220. In the illustrated example, four chemical cleaning portions 220 and two chemical supply boxes 250 are illustrated in the cleaning device 200, but this is an example, and the numbers are changed as appropriate in accordance with the specification of the cleaning device 200.

The cleaning device 200 has pipelines for transferring the DIW or the chemical, a valve, a pressure meter and the like, though not shown. Their details will be described in FIG. 6. The chemical supply box 250 has a flow meter for measuring a flow rate of the cleaning chemical to be supplied to the chemical cleaning portion 220 (see FIG. 6). An orifice flow meter for measuring the flow rate from a differential pressure of a fluid was conventionally used as this flow meter. However, an ultrasonic flow meter capable of measuring the flow rate of the cleaning chemical has been developed recently. The ultrasonic flow meter has a flow rate measurement range wider than that of the orifice flow meter and thus, the ultrasonic flow meter is employed as the flow meter provided in the chemical supply box 250 in this embodiment.

On the other hand, since the ultrasonic flow meter measures the flow rate on the basis of ultrasonic waves propagating through a pipeline, if there are air bubbles in the pipeline, ultrasonic waves are scattered, and accurate measurement becomes difficult. Thus, in this embodiment, a position of the flow meter provided in the chemical supply box 250 is set lower than a position of the nozzle for supplying the cleaning chemical to the chemical cleaning portion 220. As a result, the air bubbles in the pipeline of the flow meter can move toward the nozzle more easily, and staying of the air bubbles in the pipeline in the flow meter is suppressed.

Moreover, in this embodiment, the flow meter is configured so that a flow direction of the cleaning chemical passing through the flow meter provided in the chemical supply box 250 is directed to the vertical direction. Moreover, the flow meter is configured so that the cleaning chemical passing through the flow meter flows from down to up. As a result, since the air bubbles in the pipeline of the flow meter moves upward, staying of the air bubbles in the pipeline in the flow meter is further suppressed.

Figure 6:
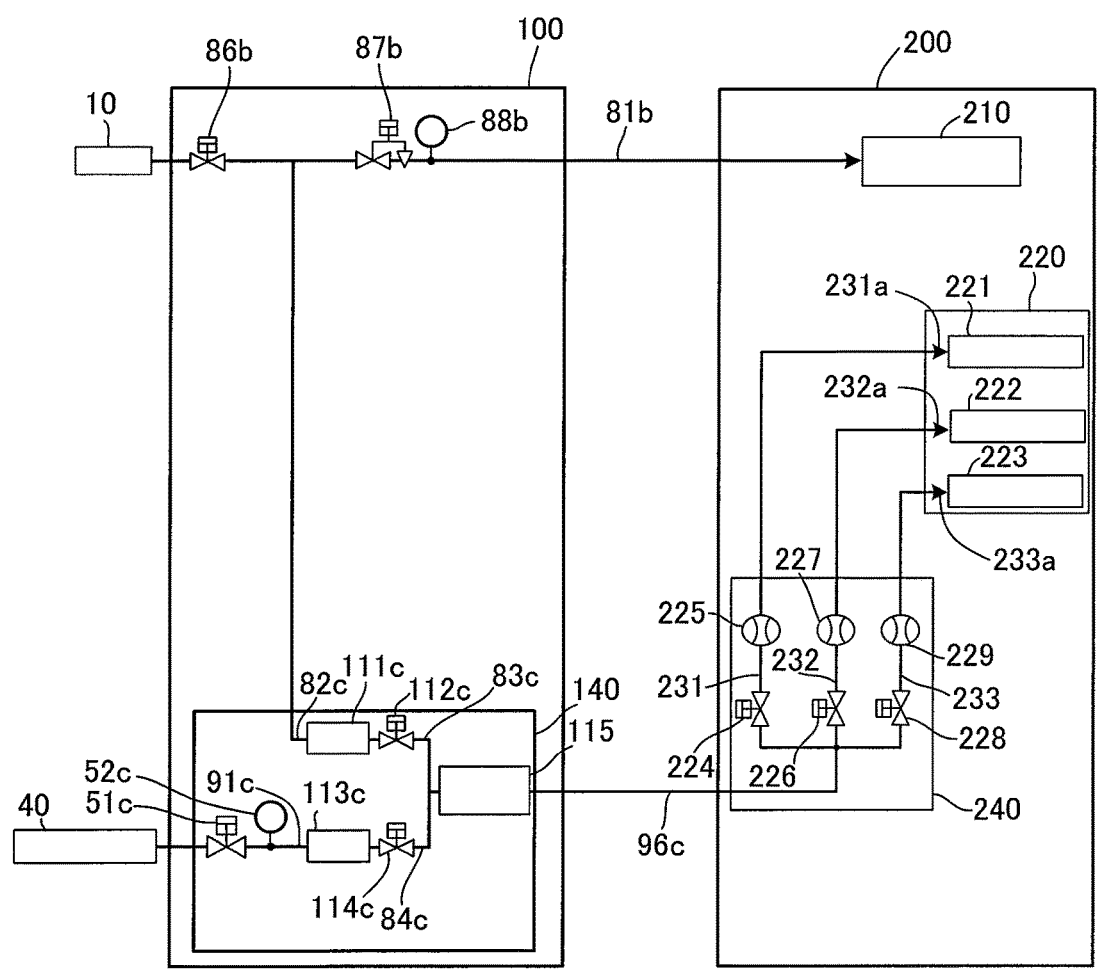
FIG. 6 is a schematic view of the cleaning unit according to the third embodiment.

Subsequently, the cleaning unit according to this embodiment will be described. FIG. 6 is a schematic view of the cleaning unit according to the third embodiment. The cleaning unit has, as illustrated, the chemical supplying device 100 (corresponding to one example of the cleaning chemical supplying device) illustrated in FIG. 4 and the cleaning device 200 (corresponding to one example of the substrate cleaning device) illustrated in FIG. 5. In FIG. 6, one of the four chemical dilution boxes 140 illustrated in FIG. 4 is shown, and one of the two chemical supply boxes 250 and one of the four chemical cleaning portions 220 illustrated in FIG. 5 are shown.

The chemical supplying device 100 is configured so as to fluidly communicate with the DIW supply source 10 for supplying the DIW, the chemical supply source 40 for supplying the chemical such as fluoric acid, ammonium or the like, for example, through a pipeline, respectively. Moreover, the chemical supplying device 100 is configured to fluidly communicate with the cleaning device 200. Specifically, the chemical supplying device 100 fluidly communicates with the cleaning device 200 so that the DIW and the diluted chemical can be supplied to the cleaning device 200.

The cleaning device 200 has the DIW cleaning portion 210 for cleaning a target by using the DIW and the chemical cleaning portion 220 for cleaning the cleaning target by using the diluted chemical (cleaning chemical). The DIW cleaning portion 210 is configured from an ultrasonic water cleaning portion or other DIW cleaning portion and the like, for example, and cleans the cleaning target such as a semiconductor substrate polished by the CMP device or the like and each portion of the CMP device by using the DIW. The chemical cleaning portion 220 is configured from a roll-type cleaning portion or a pen-type cleaning portion, for example, and cleans the cleaning target such as the semiconductor substrate polished by the CMP device or the like.

The chemical supplying device 100 includes the chemical dilution box 140 for diluting the chemical by the DIW (dilution water) and for supplying the diluted chemical (cleaning chemical) to the chemical cleaning portion 220 of the cleaning device 200.

The chemical dilution box 140 includes an in-line mixer 115 (corresponding to one example of a mixing portion), a DIWCLC 111c (corresponding to one example of a dilution water flow rate control portion), and a chemical CLC 113c (corresponding to one example of a chemical flow rate control portion). The in-line mixer 115 generates a cleaning chemical by mixing the chemical and the DIW. The DIWCLC 111c controls a flow rate of the DIW supplied from the DIW supply source 10 to the in-line mixer 115. The chemical CLC 113c controls a flow rate of the chemical supplied from the chemical supply source 40 to the in-line mixer 115. The in-line mixer 115 is configured to supply the generated cleaning chemical to the chemical cleaning portion 220.

The chemical dilution box 140 further has a DIW supply valve 112c for supplying the dilution DIW to the in-line mixer 115 from the DIW supply source 10. The DIWCLC 111c includes an ultrasonic flow meter (corresponding to one example of a third ultrasonic flow meter) for measuring a flow rate of the DIW flowing through the DIWCLC 111c. The DIWCLC 111c controls (feedback control) an opening degree of an internal control valve on the basis of the measurement result of the flow rate so that the flow rate of the DIW flowing through the DIWCLC 111c becomes a desired flow rate.

The chemical dilution box 140 further has a chemical supply valve 114c for supplying the chemical to the in-line mixer 115 from the chemical supply source 40. The chemical CLC 113c includes an ultrasonic flow meter (corresponding to one example of a second ultrasonic flow meter) for measuring a flow rate of the chemical flowing through the chemical CLC 113c. The chemical CLC 113c controls (feedback control) an opening degree of an internal control valve on the basis of the measurement result of the flow rate so that the flow rate of the chemical flowing through the chemical CLC 113c becomes a desired flow rate.

Moreover, the chemical dilution box 140 includes a chemical inlet valve 51c provided on a pipeline 91c connecting the chemical supply source 40 and the chemical CLC 113c and a pressure meter 52c for measuring a fluid pressure in the pipeline 91c. The chemical inlet valve 51c is opening/closing-controlled by a controller, not shown, for example.

The chemical supplying device 100 includes a DIW supply pipeline 81b having one end connected to the DIW supply source 10 and the other end connected to the DIW cleaning portion 210 of the cleaning device 200. In the DIW supply pipeline 81b, a DIW supply valve 86b, a DIW pressure control regulator 87b, and a DIW pressure meter 88b are provided. The DIW supply valve 86b controls supply of the DIW from the DIW supply source 10 to the DIW supply pipeline 81b by being opened/closed. The DIW pressure control regulator 87b controls a supply pressure of the DIW from the DIW supply pipeline 81b to the DIW cleaning portion 210. The DIW pressure meter 88b measures a pressure inside the DIW supply pipeline 81b.

A DIW branch pipeline 82c with one end connected to the DIWCLC 111c is connected to the DIW supply pipeline 81b between the DIW supply valve 86b and the DIW pressure control regulator 87b. A DIW pipeline 83c fluidly-communicating with the in-line mixer 115 is connected to the DIWCLC 111c. The DIW supply valve 112c is provided on the DIW pipeline 83c and is opening/closing-controlled when the DIW is supplied to the in-line mixer 115.

A chemical pipeline 84c fluidly-communicating with the in-line mixer 115 is connected to the chemical CLC 113c of the chemical dilution box 140. The chemical supply valve 114c is provided on the chemical pipeline 84c and supplies the chemical into the chemical pipeline 84c. A cleaning chemical pipeline 96b with one end connected to the cleaning device 200 is connected to the in-line mixer 115.

The DIWCLC 111c and the chemical CLC 113c of the chemical dilution box 140 are configured to be capable of receiving a signal indicating a predetermined flow rate value from a controller, not shown. On the basis of this flow rate value, opening degrees of the internal control valves of the DIWCLC 111c, and the chemical CLC 113c are controlled.

The chemical cleaning portion 220 of the cleaning device 200 includes an upper-surface cleaning portion 222 for supplying the cleaning chemical to an upper surface of a polished substrate for cleaning and a lower-surface cleaning portion 223 for supplying the cleaning chemical to a lower surface of the polished substrate for cleaning. In addition, the chemical cleaning portion 220 includes a standby portion 221 on which a substrate waiting for cleaning in the upper-surface cleaning portion 222 and the lower-surface cleaning portion 223 is arranged. The upper-surface cleaning portion 222 and the lower-surface cleaning portion 223 function as substrate cleaning portions for cleaning the upper surface and the lower surface of a single substrate at the same time. The standby portion 221 supplies the cleaning chemical to the standby substrate in order to prevent oxidation of the standby substrate.

The cleaning device 200 includes a cleaning chemical supply pipeline 231, a cleaning chemical supply pipeline 232, and a cleaning chemical supply pipeline 233. The cleaning chemical supply pipeline 231 allows a cleaning chemical pipeline 96c and the standby portion 221 to fluidly communicate with each other. The cleaning chemical supply pipeline 232 allows the cleaning chemical pipeline 96c and the upper-surface cleaning portion 222 to fluidly communicate with each other. The cleaning chemical supply pipeline 233 allows the cleaning chemical pipeline 96c and the lower-surface cleaning portion 223 to fluidly communicate with each other.

On the cleaning chemical supply pipeline 231, a cleaning chemical supply valve 224 for supplying the cleaning chemical to the standby portion 221 and a flow meter 225 for measuring a flow rate of the cleaning chemical to be supplied are provided. On the cleaning chemical supply pipeline 232, a cleaning chemical supply valve 226 for supplying the cleaning chemical to the upper-surface cleaning portion 222 and a flow meter 227 for measuring a flow rate of the cleaning chemical to be supplied are provided. On the cleaning chemical supply pipeline 233, a cleaning chemical supply valve 228 for supplying the cleaning chemical to the lower-surface cleaning portion 223 and a flow meter 229 for measuring a flow rate of the cleaning chemical to be supplied are provided. The flow meters 225, 227, and 229 and the cleaning chemical supply valves 224, 226, and 228 are accommodated in the chemical supply box 250. The cleaning chemical supply valve 224, the cleaning chemical supply valve 226, and the cleaning chemical supply valve 228 are opening/closing-controlled by a controller, not shown, for example.

A downstream-side end of the cleaning chemical supply pipeline 231 has a nozzle 231a for supplying the cleaning chemical to the standby portion 221. Moreover, a downstream-side end of the cleaning chemical supply pipeline 232 has a nozzle 232a for supplying the cleaning chemical to the upper-surface cleaning portion 222. Furthermore, a downstream-side end of the cleaning chemical supply pipeline 233 has a nozzle 233a for supplying the cleaning chemical to the lower-surface cleaning portion 223.

As described in FIG. 5, the flow meters 225, 227, and 229 in the chemical supply box 250 are ultrasonic flow meters (corresponding to one example of the first ultrasonic flow meter), respectively. These flow meters 225, 227, and 229 are positioned lower than the respective positions of the corresponding nozzles 231a, 232a, and 233a in order to measure the flow rate of the cleaning chemical more accurately in this embodiment. As a result, the air bubbles in the pipelines of the flow meters 225, 227, and 229 can move more easily toward the nozzles 231a, 232a, and 233a, and staying of the air bubbles in the pipelines in the flow meters 225, 227, and 229 is suppressed.

Moreover, as described in FIG. 5, the flow meters 225, 227, and 229 are configured such that flow directions of the cleaning chemicals passing through the flow meters 225, 227, and 229 are directed to the vertical direction. That is, as illustrated in FIG. 6, the pipelines passing through the flow meters 225, 227, and 229 are aligned in the up-and-down direction so as to be directed to the vertical direction. Moreover, the flow meters 225, 227, and 229 and the cleaning chemical supply pipelines 231, 232, and 233 are configured such that the cleaning chemicals passing through the flow meters 225, 227, and 229 flow from down to up. As a result, since the air bubbles in the flow meters 225, 227, and 229 move upward, staying of the air bubbles in the flow meters 225, 227, and 229 is further suppressed.

The "vertical direction" here includes not only a complete vertical direction but also directions having some angles with respect to the vertical direction. In other words, the "vertical direction" also includes a case in which the flow directions of the cleaning chemicals passing through the flow meters 225, 227, and 229 have some angles to the vertical direction to such a degree that the air bubbles passing through the flow meters 225, 227, and 229 can move upward without staying.

In this embodiment, the positions of the DIWCLC 111c and the chemical CLC 113c are lower than the respective positions of the nozzles 231a, 232a, and 233a similarly to the flow meters 225, 227, and 229 of the chemical supply box 250. As a result, the air bubbles in the ultrasonic flow meters provided in the DIWCLC 111c and the chemical CLC 113c can move toward the nozzles 231a, 232a, and 233a more easily, and staying of the air bubbles in the ultrasonic flow meters is suppressed.

In the example in FIG. 6, the flow directions of the DIW and the chemical flowing through the DIWCLC 111c and the chemical CLC 113c are described as a lateral direction (horizontal direction). However, the DIWCLC 111c and the chemical CLC 113c can also be configured such that the flow directions are directed to the vertical direction. In this case, since the air bubbles in the ultrasonic flow meters of the DIWCLC 111c and the chemical CLC 113c move upward, staying of the air bubbles in the ultrasonic flow meters can be further suppressed.

As described above, since the flow meters 225, 227, and 229 are ultrasonic flow meters, the size of the chemical supply box 250 including them can also be made smaller than before. Moreover, since the flow directions of the cleaning chemicals passing through the flow meters 225, 227, and 229 are the vertical directions, the chemical supply box 250 including the flow meters 225, 227, and 229 can be arranged at positions of the cleaning device 200 illustrated in FIG. 5. Moreover, the position of the chemical supply box 250 is lower than the respective positions of the nozzles 231a, 232a, and 233a. Therefore, flow rate measurement can be made while a measurement error caused by air bubbles is suppressed without increasing the size of the device.

The first embodiment to the third embodiment of the present invention have been described, but the above-described embodiments of the invention are for facilitating understanding of the present invention and are not intended to limit the present invention. It is needless to say that the present invention can be changed or improved without departing from the gist thereof and the present invention includes its equivalents. Moreover, arbitrary combinations or omissions of the constituent elements described in the claims and descriptions are possible within a range in which at least a part of the above-described problems can be solved or within a range in which at least a part of the effects can be exerted.

Specifically, the feature portions of each of the first embodiment to the third embodiment can be replaced or combined. For example, if the ultrasonic flow meter is employed for the flow meter of the CLC 111, 121, and 131 (see FIG. 2) in the first embodiment, the positions of the CLC 111, 121, and 131 may be made lower than the positions of the nozzles for supplying the cleaning chemical to the chemical cleaning portion 220. Moreover, instead of the cleaning device 200 (see FIGS. 2 and 3) in the first embodiment or the second embodiment, the cleaning device 200 (see FIG. 6) of the third embodiment can also be employed. Moreover, instead of the chemical supplying device 100 (see FIG. 6) of the third embodiment, for example, the chemical supplying device 100 (see FIGS. 2 and 3) of the first embodiment or the second embodiment can be employed.

Fourth Embodiment

Figure 7:
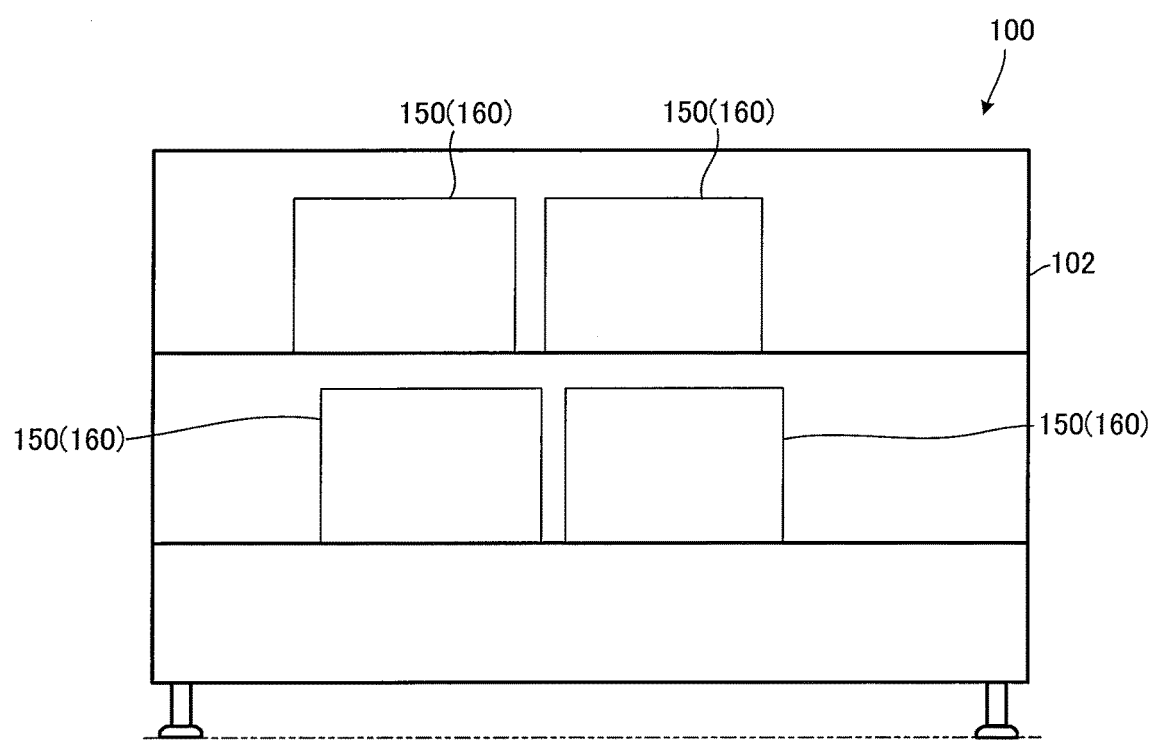
FIG. 7 is a schematic side view illustrating a chemical supplying device provided in a cleaning unit according to a fourth embodiment.

A fourth embodiment of the present invention will be described below by referring to the drawings. FIG. 7 is a schematic side view illustrating a chemical supplying device provided in a cleaning unit of this embodiment. The chemical supplying device is configured to be capable of supplying a chemical such as fluoric acid, ammonium or the like, for example, to the cleaning device for cleaning each portion of the CMP device. As illustrated in FIG. 7, the chemical supplying device 100 according to this embodiment has the case 101, a plurality of chemical dilution boxes 150 or 160 for diluting the chemical by the DIW (dilution water) and for supplying the diluted chemical (diluted chemical). In the illustrated example, the four chemical dilution boxes 150 or 160 are provided in the chemical supplying device 100, but this is an example, and the number of the chemical dilution boxes 150 or 160 is changed as appropriate in accordance with the specification of the cleaning device. As illustrated, the chemical dilution boxes 150 or 160 are accommodated in the case 101.

The chemical dilution boxes 150 or 160 are configured to be capable of mixing the DIW from the DIW supply source 10, which will be described later, and the chemical from the chemical supply source 20 or the chemical supply source 30 and of supplying the diluted chemical to the cleaning device 200 (see FIG. 8).

The chemical supplying device 100 has a pipeline for transferring the DIW or the chemical, a valve, a pressure meter and the like, though not shown. The details will be described in FIG. 8.

Figure 8:
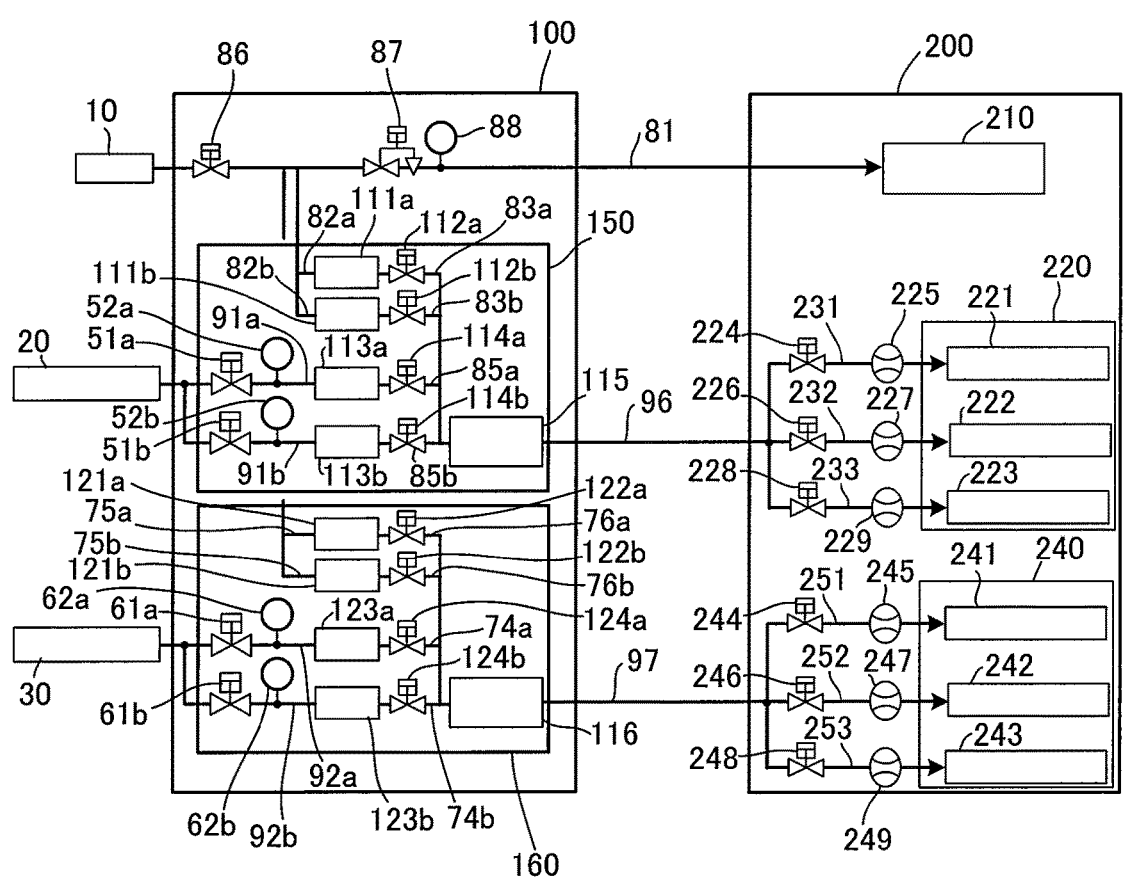
FIG. 8 is a schematic view of the cleaning unit according to the fourth embodiment.

FIG. 8 is a schematic view of a cleaning unit according to the embodiment of the present invention. As illustrated, the cleaning unit has the chemical supplying device 100 (cleaning chemical supplying device) illustrated in FIG. 7 and the cleaning device 200 (substrate cleaning device) for cleaning a substrate and each portion of the CMP device by using the cleaning chemical supplied from the chemical supplying device 100.

The chemical supplying device 100 is configured so as to fluidly communicate with the DIW supply source 10 for supplying the DIW, the chemical supply source 20 for supplying the chemical such as a fluoric acid, ammonium and the like, for example, and the chemical supply source 30 for supplying the similar chemical through pipelines, respectively. Moreover, the chemical supplying device 100 is configured to fluidly communicate with the cleaning device 200. Specifically, the chemical supplying device 100 is configured to fluidly communicate with the cleaning device 200 so that the DIW and the diluted chemical can be supplied to the cleaning device 200.

The cleaning device 200 has the DIW cleaning portion 210 for cleaning a cleaning target such as a semiconductor substrate or the like polished by a CMP device and each portion of the CMP device by using the DIW and a first chemical cleaning portion 220 and a second chemical cleaning portion 240 for cleaning the cleaning target such as the semiconductor substrate or the like polished by the CMP device by using the diluted chemical (cleaning chemical). The DIW cleaning portion 210 is configured from an ultrasonic water cleaning portion or other DIW cleaning portion and the like, for example. The first chemical cleaning portion 220 is configured from a roll-type cleaning portion, for example, and the second chemical cleaning portion 240 is configured from a pen-type cleaning portion, for example.

The chemical supplying device 100 includes the first chemical dilution box 150 for diluting the chemical by the DIW (dilution water) and for supplying the diluted chemical (diluted chemical) to the first chemical cleaning portion 220 of the cleaning device 200 and the second chemical dilution box 160 for diluting the chemical by the DIW (dilution water) and for supplying the diluted chemical to the second chemical cleaning portion 240 of the cleaning device 200.

The first chemical dilution box 150 includes the in-line mixer 115 (mixing portion) for generating a cleaning chemical by mixing the chemical and the DIW, the DIWCLC (De-Ionized Water Closed Loop Controller) 111a (first dilution water flow rate control portion) and a DIWCLC 111b (second dilution water flow rate control portion) for controlling flow rates of the DIW supplied from the DIW supply source 10 to the in-line mixer 115, and the chemical CLC 113a (first chemical flow rate control portion) and a chemical CLC 113b (second chemical flow rate control portion) for controlling the flow rates of the chemical supplied from the chemical supply source 20 to the in-line mixer 115. The in-line mixer 115 is configured to supply the generated cleaning chemical to the first chemical cleaning portion 220.

The first chemical dilution box 150 further has two DIW supply valves 112a and 112b for supplying the dilution DIW from the DIW supply source 10 to the in-line mixer 115, respectively. The DIWCLC 111a and 111b measure the flow rates of the DIW flowing through the DIWCLC 111a and 111b, respectively, and controls (feedback control) opening degrees of internal control valves so that the flow rates of the DIW flowing through the DIWCLC 111a and 111b become desired flow rates on the basis of the measurement result.

The first chemical dilution box 150 further has chemical supply valves 114a and 114b for supplying the chemical from the chemical supply source 20 to the in-line mixer 115, respectively. The chemical CLC 113a and 113b measure the flow rates of the chemicals flowing through the chemical CLC 113a and 113b, respectively, and controls (feedback control) opening degrees of internal control valves so that the flow rates of the chemicals flowing through the chemical CLC 113a and 113b become desired flow rates on the basis of the measurement result.

Moreover, the first chemical dilution box 150 includes the chemical inlet valve 51a provided on the pipeline 91a connecting the chemical supply source 20 and the chemical CLC 113a and supplying the chemical to the pipeline 91a and the pressure meter 52a for measuring a fluid pressure in the pipeline 91a. Similarly, the first chemical dilution box 150 includes a chemical inlet valve 51b provided on a pipeline 91b connecting the chemical supply source 20 and the chemical CLC 113b and supplying the chemical to the pipeline 91b and a pressure meter 52b for measuring a fluid pressure in the pipeline 91b. The chemical inlet valves 51a and 51b are opening/closing-controlled by a controller, not shown, for example.

The second chemical dilution box 160 has a configuration similar to that of the first chemical dilution box 150. That is, the second chemical dilution box 160 includes an in-line mixer 116 (mixing portion) for generating the cleaning chemical by mixing the chemical and the DIW and two DIWCLCs (De-Ionized Water Closed Loop Controllers) 121a and 121b for controlling flow rates of the DIW supplied from the DIW supply source 10 to the in-line mixer 116, and two chemical CLC 123a and 123b for controlling the flow rates of the chemical supplied from the chemical supply source 30 to the in-line mixer 116. The in-line mixer 116 is configured to supply the generated cleaning chemical to the second chemical cleaning portion 240.

The second chemical dilution box 160 further has two DIW supply valves 122a and 122b for supplying the dilution DIW from the DIW supply source 10 to the in-line mixer 116, respectively. The DIWCLC 121a and 121b measure the flow rates of the DIW flowing through the DIWCLC 121a and 121b, respectively, and controls (feedback control) opening degrees of internal control valves so that the flow rates of the DIW flowing through the DIWCLC 121a and 121b become desired flow rates on the basis of the measurement result.

The second chemical dilution box 160 further has chemical supply valves 124a and 124b for supplying the chemical from the chemical supply source 30 to the in-line mixer 116, respectively. The chemical CLC 123a and 123b measure the flow rates of the chemicals flowing through the chemical CLC 123a and 123b, respectively, and control (feedback control) opening degrees of internal control valves so that the flow rates of the chemicals flowing through the chemicals CLC 123*a* and 123*b* become desired flow rates on the basis of the measurement result.

Moreover, the second chemical dilution box 160 includes the chemical inlet valve 61*a* provided on the pipeline 92*a* connecting the chemical supply source 30 and the chemical CLC 123*a* and supplying the chemical to the pipeline 92*a* and the pressure meter 62*a* for measuring a fluid pressure in the pipeline 92*a*. Similarly, the second chemical dilution box 160 includes a chemical inlet valve 61*b* provided on a pipeline 92*b* connecting the chemical supply source 30 and the chemical CLC 123*b* and supplying the chemical to the pipeline 92*b* and a pressure meter 62*b* for measuring a fluid pressure in the pipeline 92*b*. The chemical inlet valves 61*a* and 61*b* are opening/closing-controlled by a controller, not shown, for example.

The chemical supplying device 100 includes the DIW supply pipeline 81 having one end connected to the DIW supply source 10 and the other end connected to the DIW cleaning portion 210 of the cleaning device 200. In the DIW supply pipeline 81, the DIW supply valve 86 for supplying the DIW from the DIW supply source 10 to the DIW supply pipeline 81, the DIW pressure control regulator 87 for controlling a supply pressure of the DIW from the DIW supply pipeline 81 to the DIW cleaning portion 210, and the DIW pressure meter 88 for measuring a pressure of the DIW passing through the DIW supply pipeline 81 are provided.

A DIW branch pipeline 82*a* with one end connected to the DIWCLC 111*a* is connected to the DIW supply pipeline 81 between the DIW supply valve 86 and the DIW pressure control regulator 87. The DIW pipeline 83*a* fluidly-communicating with the in-line mixer 115 is connected to the DIWCLC 111*a*. The DIW supply valve 112*a* is provided on the DIW pipeline 83*a* and is opening/closing-controlled when the DIW is supplied to the in-line mixer 115. Similarly, a DIW branch pipeline 82*b* with one end connected to the DIWCLC 111*b* is connected to the DIW supply pipeline 81 between the DIW supply valve 86 and the DIW pressure control regulator 87. A DIW pipeline 83*b* fluidly-communicating with the in-line mixer 115 is connected to the DIWCLC 111*b*. The DIW supply valve 112*b* is provided on the DIW pipeline 83*b* and is opening/closing-controlled when the DIW is supplied to the in-line mixer 115. The DIWCLC 111*b* and the DIW supply valve 112*b* are arranged between the DIW supply source 10 and the in-line mixer 115 to be in parallel with the DIWCLC 111*a* and the DIW supply valve 112*a*.

A chemical pipeline 85*a* fluidly-communicating with the in-line mixer 115 is connected to the chemical CLC 113*a* of the first chemical dilution box 150. The chemical supply valve 114*a* is provided on the chemical pipeline 85*a* and supplies the chemical into the chemical pipeline 85*a*. A cleaning chemical pipeline 96 with one end connected to the cleaning device 200 is connected to the in-line mixer 115. A chemical pipeline 85*b* fluidly-communicating with the in-line mixer 115 is connected to the chemical CLC 113*b* of the first chemical dilution box 150. The chemical supply valve 114*b* is provided on the chemical pipeline 85*b* and supplies the chemical to the chemical pipeline 85*b*. The chemical inlet valve 51*b*, the pressure meter 52*b*, the chemical CLC 113*b*, and the chemical supply valve 114*b* are arranged between the chemical supply source 20 and the in-line mixer 115 so as to be in parallel with the chemical inlet valve 51*a*, the pressure meter 52*a*, the chemical CLC 113*a*, and the chemical supply valve 114*a*.

Moreover, a DIW branch pipeline 75*a* with one end connected to the DIWCLC 121*a* is connected to the DIW supply pipeline 81 between the DIW supply valve 86 and the DIW pressure control regulator 87. A DIW pipeline 76*a* fluidly-communicating with the in-line mixer 116 is connected to the DIWCLC 121*a*. The DIW supply valve 122*a* is provided on the DIW pipeline 76*a* and is opening/closing-controlled when the DIW is supplied to the in-line mixer 116. Similarly, a DIW branch pipeline 75*b* with one end connected to the DIWCLC 121*b* is connected to the DIW supply pipeline 81 between the DIW supply valve 86 and the DIW pressure control regulator 87. A DIW pipeline 76*b* fluidly-communicating with the in-line mixer 116 is connected to the DIWCLC 121*b*. The DIW supply valve 122*b* is provided on the DIW pipeline 76*b* and is opening/closing-controlled when the DIW is supplied to the in-line mixer 116. The DIWCLC 121*b* and the DIW supply valve 122*b* are arranged between the DIW supply source 10 and the in-line mixer 116 so as to be in parallel with the DIWCLC 121*a* and the DIW supply valve 122*a*.

A chemical pipeline 74*a* fluidly-communicating with the in-line mixer 116 is connected to the chemical CLC 123*a* of the second chemical dilution box 160. The chemical supply valve 124*a* is provided on the chemical pipeline 74*a* and supplies the chemical into the chemical pipeline 74*a*. A cleaning chemical pipeline 97 with one end connected to the cleaning device 200 is connected to the in-line mixer 116. A chemical pipeline 74*b* fluidly-communicating with the in-line mixer 116 is connected to the chemical CLC 123*b* of the first chemical dilution box 160. The chemical supply valve 124*b* is provided on the chemical pipeline 74*b* and supplies the chemical to the chemical pipeline 74*b*. The chemical inlet valve 61*b*, the pressure meter 62*b*, the chemical CLC 123*b*, and the chemical supply valve 124*b* are arranged between the chemical supply source 30 and the in-line mixer 116 so as to be in parallel with the chemical inlet valve 61*a*, the pressure meter 62*a*, the chemical CLC 123*a*, and the chemical supply valve 124*a*.

The DIWCLC 111*a* and 111*b* and the chemical CLC 113*a* and 113*b* of the first chemical dilution box 150 as well as the DIWCLC 121*a* and 121*b* and the chemical CLC 123*a* and 123*b* of the second chemical dilution box 160 are configured to be capable of receiving a signal indicating a predetermined flow rate value from a controller, not shown. On the basis of this flow rate value, opening degrees of the internal control valves of the DIWCLC 111*a* and 111*b* and the chemical CLC 113*a* and 113*b* as well as the DIWCLC 121*a* and 121*b* and the chemical CLC 123*a* and 123*b* are controlled.

The first chemical cleaning portion 220 of the cleaning device 200 includes the upper-surface cleaning portion 222 (cleaning portion) for supplying the cleaning chemical to an upper surface of a polished substrate for cleaning, the lower-surface cleaning portion 223 (cleaning portion) for supplying the cleaning chemical to a lower surface of the polished substrate for cleaning, and the standby portion 221 on which a substrate waiting for cleaning in the upper-surface cleaning portion 222 and the lower-surface cleaning portion 223 is arranged. The upper-surface cleaning portion 222 and the lower-surface cleaning portion 223 function as substrate cleaning portions for cleaning the upper surface and the lower surface of a single substrate at the same time. The standby portion 221 supplies the cleaning chemical to the standby substrate in order to prevent oxidation of the standby substrate.

The cleaning device 200 includes the cleaning chemical supply pipeline 231 allowing the cleaning chemical pipeline 96 and the standby portion 221 to fluidly communicate with each other, the cleaning chemical supply pipeline 232 allowing the cleaning chemical pipeline 96 and the upper-surface cleaning portion 222 to fluidly communicate with each other, and the cleaning chemical supply pipeline 233 allowing the cleaning chemical pipeline 96 and the lower-surface cleaning portion 223 to fluidly communicate with each other.

On the cleaning chemical supply pipeline 231, the cleaning chemical supply valve 224 for supplying the cleaning chemical to the standby portion 221 and the flow meter 225 for measuring a flow rate of the cleaning chemical to be supplied are provided. On the cleaning chemical supply pipeline 232, the cleaning chemical supply valve 226 for supplying the cleaning chemical to the upper-surface cleaning portion 222 and the flow meter 227 for measuring a flow rate of the cleaning chemical to be supplied are provided. On the cleaning chemical supply pipeline 233, the cleaning chemical supply valve 228 for supplying the cleaning chemical to the lower-surface cleaning portion 223 and the flow meter 229 for measuring a flow rate of the cleaning chemical to be supplied are provided. The cleaning chemical supply valve 224, the cleaning chemical supply valve 226, and the cleaning chemical supply valve 228 are opening/closing-controlled by a controller, not shown, for example.

The second chemical cleaning portion 240 of the cleaning device 200 includes an upper-surface cleaning portion 242 (cleaning portion) for supplying the cleaning chemical to an upper surface of a polished substrate for cleaning, a lower-surface cleaning portion 243 (cleaning portion) for supplying the cleaning chemical to a lower surface of the polished substrate for cleaning, and a standby portion 241 on which a substrate waiting for cleaning in the upper-surface cleaning portion 242 and the lower-surface cleaning portion 243 is arranged. The upper-surface cleaning portion 242 and the lower-surface cleaning portion 243 function as substrate cleaning portions for cleaning the upper surface and the lower surface of a single substrate at the same time. The standby portion 241 supplies the cleaning chemical to the standby substrate in order to prevent oxidation of the standby substrate.

The cleaning device 200 includes a cleaning chemical supply pipeline 251 allowing the cleaning chemical pipeline 97 and the standby portion 241 to fluidly communicate with each other, a cleaning chemical supply pipeline 252 allowing the cleaning chemical pipeline 97 and the upper-surface cleaning portion 242 to fluidly communicate with each other, and a cleaning chemical supply pipeline 253 allowing the cleaning chemical pipeline 97 and the lower-surface cleaning portion 243 to fluidly communicate with each other.

On the cleaning chemical supply pipeline 251, a cleaning chemical supply valve 244 for supplying the cleaning chemical to the standby portion 241 and a flow meter 245 for measuring a flow rate of the cleaning chemical to be supplied are provided. On the cleaning chemical supply pipeline 252, a cleaning chemical supply valve 246 for supplying the cleaning chemical to the upper-surface cleaning portion 242 and a flow meter 247 for measuring a flow rate of the cleaning chemical to be supplied are provided. On the cleaning chemical supply pipeline 253, a cleaning chemical supply valve 248 for supplying the cleaning chemical to the lower-surface cleaning portion 243 and a flow meter 249 for measuring a flow rate of the cleaning chemical to be supplied are provided. The cleaning chemical supply valve 244, the cleaning chemical supply valve 246, and the cleaning chemical supply valve 248 are opening/closing-controlled by a controller, not shown, for example.

In the chemical supplying device 100 according to this embodiment, in order to supply the chemical within a wide flow rate range, it is configured such that the flow rate range of the chemical controllable by the chemical CLC 113a and the chemical CLC 123a is different from the flow rate range of the chemical controllable by the chemical CLC 113b and the chemical CLC 123b. Specifically, the chemical CLC 113a and the chemical CLC 123a are configured such that the chemical flow rate is controllable within a relatively low flow rate range (first range), while the chemical CLC 113b and the chemical CLC 123b are configured such that the chemical flow rate is controllable within a relatively high flow rate range (second range), and it is configured such that the flow rate range controllable by the chemical CLC 113a and the chemical CLC 123a is partially overlapped with the flow rate range controllable by the chemical CLC 113b and the chemical CLC 123b.

In the chemical supplying device 100 according to this embodiment, the flow rate range controllable by the chemical CLC 113a and the chemical CLC 123a is 30 mL/min or more and 300 mL/min or less, and the flow rate range controllable by the chemical CLC 113b and the chemical CLC 123b is 250 mL/min or more and 2500 mL/min or less. Therefore, the chemical flow rate range that can be supplied to the in-line mixer 115 by using the chemical CLC 113a and the chemical CLC 113b is 30 mL/min or more and 2800 mL/min or less. Similarly, the chemical flow rate range that can be supplied to the in-line mixer 116 by using the chemical CLC 123a and the chemical CLC 123b is 30 mL/min or more and 2800 mL/min or less.

Moreover, in the chemical supplying device 100 according to this embodiment, in order to supply the DIW within a wider flow rate range, it is configured such that the flow rate range of the DIW controllable by the DIWCLC 111a and the DIWCLC 121a is different from the flow rate range of the DIW controllable by the DIWCLC 111b and the DIWCLC 121b. Specifically, the DIWCLC 111a and the DIWCLC 121a are configured such that the DIW flow rate is controllable within a relatively low flow rate range (third range), while the DIWCLC 111b and the DIWCLC 121b are configured such that the DIW flow rate is controllable within a relatively high flow rate range (fourth range), and the flow rate range controllable by the DIWCLC 111a and the DIWCLC 121a is partially overlapped with the flow rate range controllable by the DIWCLC 111b and the DIWCLC 121b.

In the chemical supplying device 100 according to this embodiment, the flow rate range controllable by the DIWCLC 111a and the DIWCLC 121a is 200 mL/min or more and 2000 mL/min or less, and the flow rate range controllable by the DIWCLC 111b and the DIWCLC 121b is 400 mL/min or more and 4000 mL/min or less. Therefore, the DIW flow rate range that can be supplied to the in-line mixer 115 by using the DIWCLC 111a and the DIWCLC 111b is 200 mL/min or more and 6000 mL/min or less. Similarly, the DIW flow rate range that can be supplied to the in-line mixer 116 by using the DIWCLC 121a and the DIWCLC 121b is 200 mL/min or more and 6000 mL/min or less.

In this embodiment, the flow rate range of the chemical is 30 mL/min or more and 2800 mL/min or less, and the flow rate range of the DIW is 200 mL/min or more and 6000 mL/min or less, and thus, a range of a dilution ratio between the chemical and the DIW is 1:1 or more and 1:200 or less (chemical:DIW).

In the CLC of the chemical or the DIW, a differential-type flow meter (orifice flow meter) is used in general. In the CLC where the orifice flow meter is used, it is known that the smaller the flow rate of the control range is, the smaller the orifice diameter becomes, and thus, a pressure loss with respect to the flow rate increases, while the smaller the flow rate of the control range is, the better the control accuracy becomes. Similarly, the larger the flow rate of the control range is, the larger the orifice diameter becomes, and thus, it is known that the pressure loss with respect to the flow rate decreases, while the larger the flow rate of the control range is, the poorer the control accuracy becomes.

Thus, in the chemical supplying device 100 of this embodiment, when the chemical or the DIW at a relatively low flow rate is to be supplied to the cleaning device 200, the chemical CLC 113a and the chemical CLC 123a or the DIWCLC 111a and the DIWCLC 121a controllable within the relatively low flow rate range are used. As a result, the low flow rate of the chemical or the DIW can be supplied with high control accuracy. On the other hand, when the chemical or the DIW in a relatively high flow rate is to be supplied to the cleaning device 200, the chemical CLC 113b and the chemical CLC 123b or the DIWCLC 111b and the DIWCLC 121b controllable within the relatively high flow rate range are used. As a result, a pressure loss can be reduced, and the high flow rate of the chemical or the DIW can be supplied. In this case, the control accuracy becomes somewhat poorer, but since the chemical or the DIW is supplied at a high flow rate, the influence is smaller than the case of the low flow rate.

The cleaning chemical supplied from the in-line mixers 115 and 116 are used not only for cleaning of the substrate in the upper-surface cleaning portions 222 and 242 and the lower-surface cleaning portions 223 and 243 but also used for preventing oxidation of the substrate for the substrate waiting for cleaning (substrate to be cleaned next) in the standby portions 221 and 241. In the chemical supplying device 100 according to this embodiment, by performing cleaning of the substrate and standby for cleaning at the same time, a throughput of the cleaning process is improved. When cleaning of the substrate and standby for cleaning are performed at the same time, since the cleaning chemical is used for each of the processes, high flow rates of the chemical and the DIW are required. Thus, in this embodiment, as described above, it is so configured that the two CLCs whose controllable flow rate ranges are partially overlapped are used so that the chemical or the DIW can be supplied to the cleaning device 200. Here, in the flow rate ranges of the two CLCs whose controllable flow rate ranges are partially overlapped, one of them has a relatively low flow rate, while the other has a relatively high flow rate. Therefore, by using the CLC of the low flow rate range, the supply process of the chemical or the DIW in the low flow rate can be handled. Moreover, by using the CLC of the high flow rate range, the supply process of the chemical or the DIW in the high flow rate range can be handled. Furthermore, by using the two CLCs at the same time, the flow rate integrating the flow rates controllable by the two CLCs can be supplied to the cleaning device 200 and thus, a process requiring a particularly high flow rate of the cleaning chemical such as the process in which cleaning of the substrate and standby for cleaning are performed at the same time can be handled.

Figure 9:
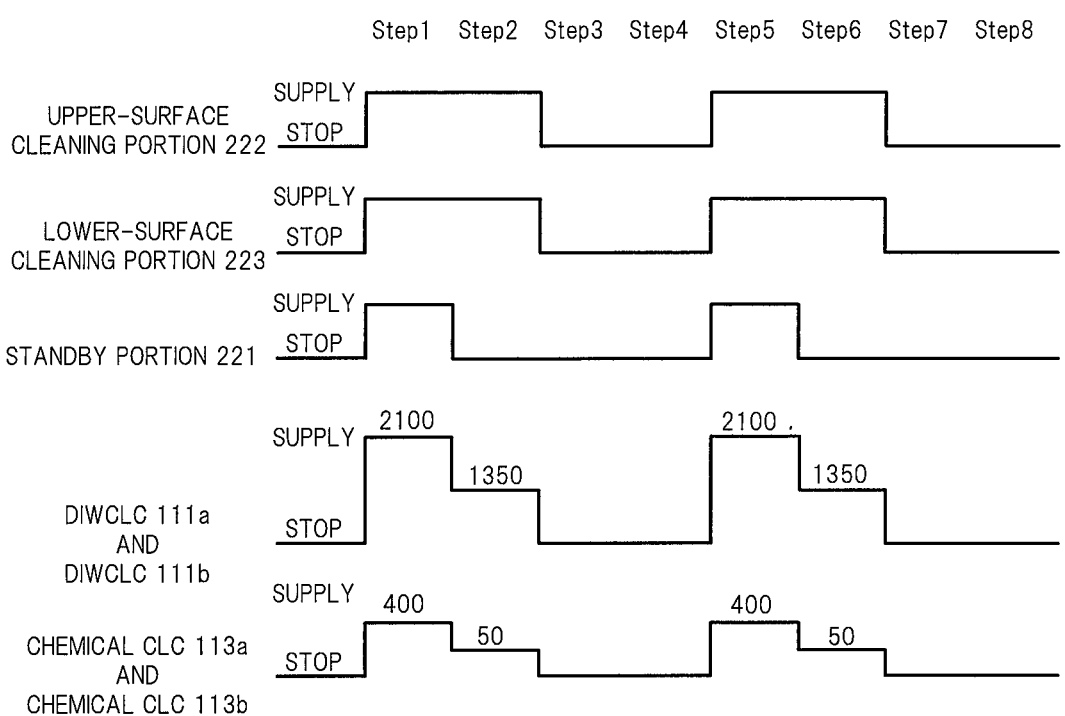
FIG. 9 is a chart illustrating a supply process of DIW and a chemical of the cleaning unit according to the fourth embodiment.

A supply process of the DIW and the chemical of the cleaning unit illustrated in FIG. 8 will be described below. FIG. 9 is a chart illustrating the supply process of the DIW and the chemical of the cleaning unit illustrated in FIG. 8. The supply process of the DIW and the chemical supplied from the second chemical dilution box 160 to the second chemical cleaning portion 240 illustrated in FIG. 8 is similar to the supply process of the DIW and the chemical supplied from the first chemical dilution box 150 to the first chemical cleaning portion 220 and thus, the explanation will be omitted here.

When the chemical is to be supplied to the first chemical cleaning portion 220 of the cleaning device 200 illustrated in FIG. 8, first, the chemical inlet valve 51a and the chemical inlet valve 51b of the first chemical dilution box 150 are opened. A flow rate of the chemical is controlled in the chemical CLC 113a and the chemical CLC 113b of the first chemical dilution box 150, respectively, and a predetermined flow rate of the chemical is supplied from the chemical supply source 20 to the in-line mixer 115. As illustrated in FIG. 9, in this embodiment, the chemical CLC 113a and the chemical CLC 113b supply the chemical at a flow rate of 400 mL/min at Step 1.

Similarly, the DIW supply valve 86 of the DIW supply pipeline 81 is opened, and the DIW is supplied from the DIW supply source 10 to the DIWCLC 111a and the DIWCLC 111b of the first chemical dilution box 150. The DIWCLC 111a and the DIWCLC 111b control the flow rate of the DIW, respectively. By opening the DIW supply valves 112a and 112b, a predetermined flow rate of the DIW is supplied from the DIWCLC 111a and the DIWCLC 111b to the in-line mixer 115. As illustrated in FIG. 9, in this embodiment, the DIWCLC 111a and the DIWCLC 111b supply the DIW at a flow rate of 2100 mL/min at Step 1.

The chemical and the DIW supplied to the in-line mixer 115 are mixed. The cleaning chemical generated as the result is supplied to the first chemical cleaning portion 220 through the cleaning chemical pipeline 96.

In the first chemical cleaning portion 220, in order to supply the cleaning chemical to the upper-surface cleaning portion 222 and the lower-surface cleaning portion 223, the cleaning chemical supply valve 226 and the cleaning chemical supply valve 228 are opened. As a result, as illustrated at Step 1 in FIG. 9, the upper-surface cleaning portion 222 and the lower-surface cleaning portion 223 supply the cleaning chemical to the substrate to clean the upper surface and the lower surface of the substrate.

In order to prevent oxidation of another substrate waiting for cleaning in the standby portion 221, the first chemical cleaning portion 220 needs to supply the cleaning chemical also to the standby portion 221. Thus, the cleaning chemical supply valve 224 is opened. As a result, as illustrated at Step 1 in FIG. 9, the standby portion 221 supplies the cleaning chemical to the substrate. As the cleaning chemical is supplied to the substrate, the substrate surface is wetted and is no longer in contact with air, oxidation of the substrate surface is prevented.

As illustrated at Step 2 in FIG. 9, the upper-surface cleaning portion 222 and the lower-surface cleaning portion 223 supply the cleaning chemical to the substrate subsequent to Step 1. On the other hand, in the standby portion 221, if the surface of the standby substrate is sufficiently wetted, as illustrated at Step 2, supply of the cleaning chemical is stopped. That is, the cleaning chemical supply valve 224 of the first chemical cleaning portion 220 is closed.

At the same time, at Step 2, the flow rate of the chemical is controlled in the chemical CLC 113a and the chemical CLC 113b of the first chemical dilution box 150, respectively. That is, the flow rate of the chemical is reduced for a portion of the cleaning chemical caused by the stop of supply in the standby portion 221. As illustrated in FIG. 9, in this embodiment, the chemical CLC 113a and the chemical CLC 113b supply the chemical at a flow rate of 50 mL/min at Step 2.

Similarly, at Step 2, the flow rates of the respective DIW are controlled in the DIWCLC 111a and the DIWCLC 111b of the first chemical dilution box 150. That is, the flow rate of the DIW is reduced for a portion of the cleaning chemical caused by the stop of supply in the standby portion 221. As illustrated in FIG. 9, in this embodiment, the DIWCLC 111a and the DIWCLC 111b supply the DIW at a flow rate of 1350 mL/min at Step 2.

At Step 3 and Step 4 illustrated in FIG. 9, a transfer operation of the cleaned substrate, a DIW rinsing operation of the cleaned substrate and the like are performed.

Subsequently, at Step 5 to Step 8, steps similar to those at Step 1 to Step 4 are performed. Specifically, another substrate is cleaned in the upper-surface cleaning portion 222 and the lower-surface cleaning portion 223, while another substrate to be cleaned next is made to standby in the standby portion 221 (Step 5). The supply of the cleaning chemical in the standby portion 221 is stopped, and the flow rates of the DIW and the chemical are reduced (Step 6). The cleaned substrate is transferred, and the rinsing operation of the DIW and the like are performed (Step 7 and Step 8).

As described above, in the cleaning unit according to this embodiment, since the DIWCLC 111a and the DIWCLC 111b whose controllable flow rate ranges are partially overlapped with each other and the chemical CLC 113a and the chemical CLC 113b whose controllable flow rate ranges are partially overlapped with each other are provided, the controllable flow rate range can be made wider. Thus, in the cleaning device 200 having the upper-surface cleaning portion 222 as well as the lower-surface cleaning portion 223 for cleaning the substrate and the standby portion 221 where the substrate to be cleaned is made to standby, cleaning of the substrate in the upper-surface cleaning portion 222 and the lower-surface cleaning portion 223 and supply of the cleaning chemical to the standby substrate in the standby portion 221 can be performed at the same time, and a throughput of the cleaning process can be improved more than before. Moreover, the cleaning unit according to this embodiment can also handle the process requiring a low flow rate.

The chemical supplying device 100 of the cleaning unit according to this embodiment is configured to have the first chemical dilution box 150 and the second chemical dilution box 160, but it may be so configured to have only the first chemical dilution box 150 or to further have another chemical dilution box in accordance with the constitution of the cleaning device 200.

The embodiments of the present invention have been described above, but the above-described embodiments of the invention are for facilitating understanding of the present invention and are not to limit the present invention. The present invention can be changed or improved without deviating from the gist thereof, and it is needless to say that the present invention includes its equivalents. Moreover, arbitrary combinations or omissions of each of the constituent elements described in the claims and description can be made within a range in which at least a part of the above-described problems can be solved or within a range in which at least a part of the effects can be exerted.

REFERENCE SIGNS LIST 51, 51a First chemical inlet valve
61, 61a Second chemical inlet valve
72, 72a First in-line mixer
73, 73a Second in-line mixer
100 Chemical supplying device
110 DIWCLC box
120 First chemical CLC box
130 Second chemical CLC box
100 Chemical supplying device
111a, 111b, 121a, 121b DIWCLC
113a, 113b, 123a, 123b Chemical CLC
115, 116 In-line mixer
200 Cleaning device
221, 241 Standby portion
222, 242 Upper-surface cleaning portion
223, 243 Lower-surface cleaning portion
225, 227, 229 Flow meter
231a, 232a, 233a Nozzle

What is claimed is:

1. A device adapted to supply a cleaning chemical to a substrate cleaning device, comprising:
   a De-Ionized Water ("DIW") supply source;
   a DIW supply pipeline adapted to be fluidly coupled to the DIW supply source and the substrate cleaning device, the DIW supply pipeline including a DIW supply valve and a DIW pressure control regulator;
   a DIW branch pipeline, the DIW branch pipeline connected to the DIW supply pipeline between the DIW supply valve and the DIW pressure control regulator;
   a dilution water switching unit adapted to be fluidly coupled to the DIW branch pipeline, a first DIW pipeline and a second DIW pipeline;
   a first chemical supply source;
   a first chemical supply pipeline fluidly communicating with the first chemical supply source;
   a first chemical control device fluidly communicating with the first chemical supply pipeline and a first chemical pipeline;
   a second chemical supply source;
   a second chemical supply pipeline fluidly communicating with the second chemical supply source;
   a second chemical control device fluidly communicating with the second chemical supply pipeline and a second chemical pipeline;
   a first mixing unit fluidly coupled to each of the first chemical pipeline, the first dilution water pipeline, and a first cleaning chemical pipeline, the first cleaning chemical pipeline fluidly communicating with the substrate cleaning device; and
   a second mixing unit fluidly coupled to each of the second chemical pipeline, the second dilution water pipeline, and a second cleaning chemical pipeline, the second cleaning chemical pipeline fluidly communicating with the substrate cleaning device;
   wherein the dilution water switching unit includes a DIW closed loop controller ("CLC"), a first supply valve of the first DIW pipeline and a second supply valve of the second DIW pipeline, the DIW CLC includes a DIW internal control valve, the DIW CLC measures a flow rate of DIW flowing through the DIW CLC and controls the DIW internal control valve on the basis of the measured flow rate of DIW;
   wherein the first chemical control device includes at least a first CLC, the first CLC includes a first internal control valve, the first CLC measures a flow rate of first chemical flowing through the first CLC and controls the first internal control valve on the basis of the measured flow rate of the first chemical; and
   wherein the second chemical control device includes at least a second CLC, the second CLC includes a second internal control valve, the second CLC measures a flow rate of second chemical flowing through the second CLC and controls the second internal control valve on the basis of the measured flow rate of the second chemical.

2. The device according to claim 1, wherein
the first chemical control device is adapted to block flow through the first chemical pipeline during flow of the second chemical through the second chemical pipeline to the substrate cleaning device; and
the second chemical control device is adapted to block flow through the second chemical pipeline during flow of the first chemical through the first chemical pipeline to the substrate cleaning device.

3. The device according to claim 1, wherein the dilution water switching unit is adapted to supply the DIW to the first mixing unit while the first chemical control device supplies the first chemical to the first mixing unit and to supply the DIW to the second mixing unit while the second chemical control device supplies the second chemical to the second mixing unit.

4. The device according to claim 1, further comprising:
a first chemical inlet valve provided on the first chemical supply pipeline; and
a second chemical inlet valve provided on the second chemical supply pipeline.

5. The device according to claim 1, wherein one of the first chemical and the second chemical is an alkaline chemical while the other is an acid chemical.

6. A device adapted to supply a cleaning chemical to a substrate cleaning device, comprising:
a De-Ionized Water ("DIW") supply source;
a DIW supply pipeline adapted to be fluidly coupled to the DIW supply source and the substrate cleaning device, the DIW supply pipeline including a DIW supply valve and a DIW pressure control regulator;
a DIW branch pipeline, the DIW branch pipeline connected to the DIW supply pipeline between the DIW supply valve and the DIW pressure control regulator;
a dilution water switching unit adapted to be fluidly coupled to the DIW branch pipeline, a first DIW pipeline and a second DIW pipeline;
a first mixing unit fluidly coupled to each of a first chemical pipeline, a first dilution water pipeline, and a first cleaning chemical pipeline, the first cleaning chemical pipeline fluidly communicating with the substrate cleaning device; and
a second mixing unit fluidly coupled to each of a second chemical pipeline, a second dilution water pipeline, and a second cleaning chemical pipeline, the second cleaning chemical pipeline fluidly communicating with the substrate cleaning device;
wherein the dilution water switching unit includes a DIW closed loop controller ("CLC"), a first supply valve of the first DIW pipeline and a second supply valve of the second DIW pipeline, the DIW CLC includes a DIW internal control valve, the DIW CLC measures a flow rate of DIW flowing through the DIW CLC and controls the DIW internal control valve on the basis of the measured flow rate of DIW,
the dilution water switching unit configured to switch the situations of (i) supplying the DIW to the second DIW pipeline by closing the first supply valve of the first DIW pipeline and opening the second supply valve of the second DIW pipeline, and (ii) supplying the DIW to the first DIW pipeline by opening the first supply valve of the first DIW pipeline and closing the second supply valve of the second DIW pipeline, respectively, and,
the DIW CLC of the dilution water switching unit is configured to control the flow rate of the DIW which flows inside the first DIW pipeline and the flow rate of the DIW which flows inside the second DIW pipeline, respectively.

* * * * *